US012787202B2

(12) United States Patent
Nguyen et al.

(10) Patent No.: US 12,787,202 B2
(45) Date of Patent: Nov. 3, 2026

(54) LATCHING ASSEMBLY FOR A RISER CAGE BRACKET

(71) Applicant: HEWLETT PACKARD ENTERPRISE DEVELOPMENT LP, Spring, TX (US)

(72) Inventors: Minh H. Nguyen, Katy, TX (US); Peng ChiangHsieh, Taipei (TW); Ping Hung Chen, Taipei (TW)

(73) Assignee: Hewlett Packard Enterprise Development LP, Spring, TX (US)

( * ) Notice: Subject to any disclaimer, the term of this patent is extended or adjusted under 35 U.S.C. 154(b) by 288 days.

(21) Appl. No.: 18/409,226

(22) Filed: Jan. 10, 2024

(65) Prior Publication Data

US 2025/0227868 A1 Jul. 10, 2025

(51) Int. Cl.

| | |
|---|---|
| ***H05K 7/00*** | (2006.01) |
| ***G06F 1/183*** | (2026.01) |
| ***H05K 7/14*** | (2006.01) |

(52) U.S. Cl.

CPC ........... *H05K 7/1461* (2013.01); *G06F 1/183* (2013.01); *H05K 7/1409* (2013.01); *H05K 7/1489* (2013.01)

(58) Field of Classification Search

CPC .. H05K 7/1461; H05K 7/1409; H05K 7/1489; G06F 1/183

See application file for complete search history.

(56) References Cited

U.S. PATENT DOCUMENTS

| | | | | |
|---|---|---|---|---|
| 5,831,821 A * | 11/1998 | Scholder | H05K 7/1429 361/679.58 |
| 7,806,489 B2 | 10/2010 | Selvidge et al. | |
| 8,837,135 B2 * | 9/2014 | Zheng | G06F 1/186 361/801 |
| 9,629,291 B1 * | 4/2017 | Chen | G06F 1/186 |

(Continued)

FOREIGN PATENT DOCUMENTS

| | | |
|---|---|---|
| CN | 115705083 A | 2/2023 |
| WO | 2019/062888 A1 | 4/2019 |

OTHER PUBLICATIONS

Extended European Search Report received for EP Application No. 24187835.4, mailed on Dec. 23, 2024, 9 pages.

*Primary Examiner* — Imani N Hayman
*Assistant Examiner* — Rashen E Morrison
(74) *Attorney, Agent, or Firm* — Hewlett Packard Enterprise Patent Department

(57) ABSTRACT

A riser cage assembly including a riser cage bracket and a latching assembly having a lever and a slider, is disclosed. The riser cage bracket includes a side portion and a window portion coupled perpendicularly to the side portion such that a space is defined between the side and window portions to receive and couple an expansion card to a riser card mounted on the side portion. The lever is rotatably coupled to the side portion and the slider is movably coupled to the lever and the side portion. The slider extends parallel to a longitudinal dimension of the side portion and includes first and second latching elements adjacent to distal and proximal ends, respectively, of the slider. The lever is actuatable to drive the slider to translate horizontally relative to the side portion between first and second positions corresponding to fastened and unfastened states, respectively, of the latching assembly.

18 Claims, 14 Drawing Sheets

(56) References Cited

U.S. PATENT DOCUMENTS

| | | | | |
|---|---|---|---|---|
| 11,522,307 | B2 | 12/2022 | Jhou et al. | |
| 11,537,181 | B1 * | 12/2022 | Wang | G06F 1/186 |
| 2011/0310583 | A1 * | 12/2011 | Chiu | G06F 1/186 361/809 |
| 2012/0281373 | A1 | 11/2012 | Bohannon et al. | |
| 2013/0088831 | A1 * | 4/2013 | Zheng | H05K 7/1422 361/679.43 |
| 2014/0106595 | A1 * | 4/2014 | Zhu | G06F 1/186 439/345 |
| 2021/0360812 | A1 * | 11/2021 | Chen | G06F 1/185 |
| 2022/0057848 | A1 * | 2/2022 | Chang | H05K 5/0265 |
| 2022/0075431 | A1 * | 3/2022 | Tzeng | G06F 1/186 |
| 2022/0114130 | A1 * | 4/2022 | Lin | G06F 13/4221 |
| 2022/0312621 | A1 | 9/2022 | Chang et al. | |
| 2023/0051799 | A1 | 2/2023 | Tsorng et al. | |
| 2023/0225070 | A1 | 7/2023 | Hung et al. | |
| 2023/0413469 | A1 * | 12/2023 | Mao | H05K 7/1429 |
| 2024/0164043 | A1 * | 5/2024 | Tsorng | G06F 1/185 |
| 2024/0276664 | A1 * | 8/2024 | Escamilla | H05K 7/1409 |

* cited by examiner

LATCHING ASSEMBLY FOR A RISER CAGE BRACKET

BACKGROUND

Information processing devices, such as servers, generally have a primary system board (e.g., a motherboard or a host platform module) which includes a variety of components, such as power conversion circuitry, one or more processor sockets to receive processors, one or more memory sockets to receive memory devices, electrical and communications interconnects and busses, various controllers, chipsets (such as a baseboard management controller (BMC)), and others. In addition, to allow for more components to be added to the information processing device, the primary system board may also include connectors, which may be configured to removably receive an electronic module. The addition of such electronic modules generally expands the capability or functionality of the information processing device, and thus the connectors and the electronic modules may be known as expansion slots and expansion cards, respectively. Examples of such expansion slots include PCIe connectors, which come in different sizes and configurations (e.g., x16, x8, x1, etc.), M.2 connectors, and so on. Examples of common types of expansion cards include video cards or graphic processing units (GPUs), networking interface cards (NICs), storage controllers, hardware accelerators, and so on.

However, in some information processing devices, it may not be possible to directly connect the expansion card to the expansion slot (e.g., due to orientation or space constraints), and thus the expansion card may be coupled to an intermediate card called a riser card, which is in turn connected to the expansion slot of the primary system board. The riser card is a printed circuit board assembly (PCA) that carries one electrical connector that is suitable for receiving the expansion card and another electrical connector suitable for being detachably connected to the expansion slot of the primary system board. These connectors are arranged such that, when everything is connected, the expansion card fits as desired within the space constraints of the system.

For example, in some information processing devices, the expansion slots of the primary system board are oriented to receive expansion cards extending perpendicularly to the primary system board (a "vertical orientation"), but some information processing devices (e.g., 1 U or 2 U servers) there may not be sufficient vertical clearance for an expansion card to have such a vertical orientation. However, the riser card may be much shorter than the expansion card, and thus the riser card can be connected to the expansion slot in the vertical orientation, and then the expansion card may be connected to the riser card in an orientation parallel to the primary system board (a "horizontal orientation"), thus allowing the expansion card to fit within the information processing device. However, the electrical connections of the expansion slot and the riser card are generally not robust enough to physically support and secure the riser card and expansion card. Thus, the riser cards and expansion cards are generally deployed with a supporting structure, e.g., a riser cage bracket to support and secure them to a chassis and/or the primary system board of the information processing device. The riser cage bracket and the riser card supported by the riser cage bracket may be referred to collectively as a riser cage assembly, and when the expansion card is coupled to the riser card it may also be considered as part of the riser cage assembly.

BRIEF DESCRIPTION OF THE DRAWINGS

Various examples will be described below with reference to the following figures.

DETAILED DESCRIPTION

Figure 1:
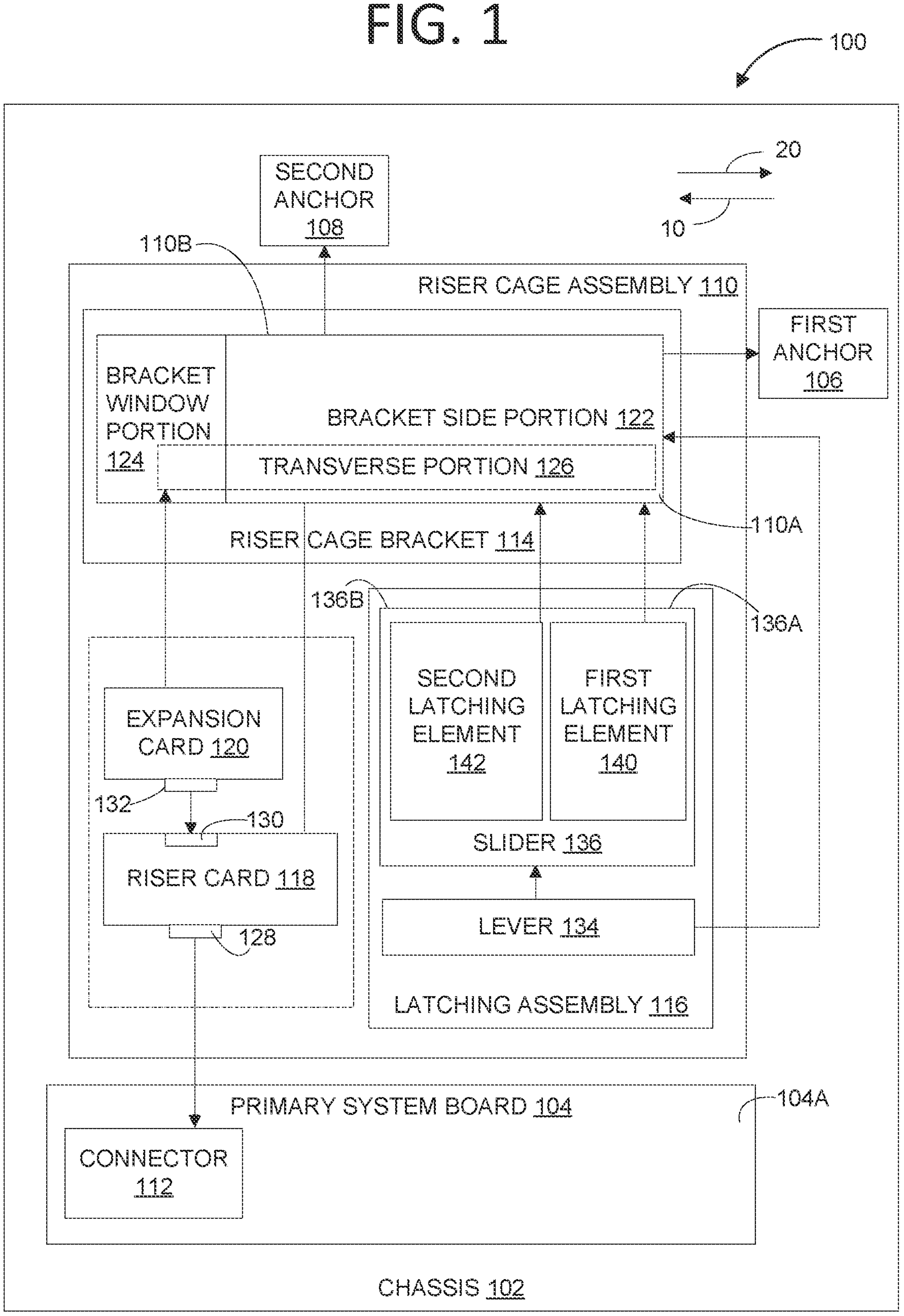
FIG. 1 illustrates a block diagram of an example information processing device according to an example of the present disclosure.

The following detailed description refers to the accompanying drawings. For purposes of explanation, certain examples are described with reference to the components illustrated in FIGS. 1-10. The functionality of the illustrated components may overlap, however, and may be present in a fewer or greater number of elements and components. Moreover, the disclosed examples may be implemented in various environments and are not limited to the illustrated examples. Wherever possible, the same reference numbers are used in the drawings and the following description to refer to the same or similar parts. It is to be expressly understood, however, that the drawings are for the purpose of illustration and description only. While several examples are described in this document, modifications, adaptations, and other implementations are possible. Accordingly, the following detailed description does not limit the disclosed examples. Instead, the proper scope of the disclosed examples may be defined by the appended claims.

An information processing device generally includes one or more actuatable fasteners to secure a riser cage assembly to a chassis of the information processing device. In some circumstances, it may be desired for these fasteners to be manually actuatable without the use of tools, as this may make installation and removal of the riser cage assembly easier. However, in some information processing devices, there may be insufficient free space to accommodate certain toolless fasteners and additionally, many toolless fasteners tend to require free space around them to allow a user to grasp and actuate such fasteners. For example, fasteners that are actuated manually by twisting a knob, a handle, or other similar structures of the fasteners may be difficult to actuate within the information processing device which has little lateral free space around the fastener, as the user's fingers may be blocked from being positioned around the lateral sides of the fastener, and therefore the user might not be able to obtain a solid grasp on the fastener. Furthermore, some toolless fasteners can be physically difficult and/or non-intuitive to actuate, such as some fasteners that require the user to hold the fastener, push the fastener down, and then turn the fastener to attach the riser cage bracket to the information processing device. Thus, it can be challenging to provide a fastener that is easy to operate within tight space constraints of the information processing device to attach and/or remove the riser cage bracket. Additionally, in some systems, certain fasteners (e.g., thumbscrews) are a loose part of the information processing device (i.e., when in an fastened state, they are not affixed to any other part of the device), and therefore there may be possibilities of misplacing the fasteners during maintenance or replacement activities of the riser cage assembly, thereby necessitating procuring new fasteners, which may delay reinstallation of the riser cage assembly post such maintenance or replacement activities.

A technical solution to the aforementioned problems may include providing a latching assembly for a riser cage assembly, which is attached to a riser cage bracket and operable by moving a lever to either fasten the riser cage assembly or release the riser cage assembly from an information processing device. The lever can be actuated by a single, relatively simple, user action—pulling the lever (to pivot the lever in one direction) or pushing the lever (to pivot the lever in the opposite direction). In other words, the latching assembly is a toolless instrument, which can be operated by just pushing a lever to fasten the riser cage assembly or pulling the lever to release the riser cage assembly. The actions of pushing or pulling the lever entail the application of force along a single direction, and which is relatively simple, easy, and intuitive for a user to perform. In contrast, the actuation of some other fasteners may require a user to perform multiple different actions and/or apply forces along multiple directions (simultaneously or in sequence), such as grasping, pushing down, and turning the fastener, and therefore the actuation of these other fasteners may be more difficult, more complex, and less intuitive.

More specifically, in some examples the latching assembly includes a slider that is movably coupled to the lever and driven by the lever (e.g., by the pivoting motion of the lever) to translate horizontally relative to the riser cage bracket between a first position corresponding to a fastened state of the latching assembly and a second position corresponding to an unfastened state of the latching assembly. The slider includes a latching element that engages with a complementary anchor of the information processing device in response to the slider translating to the first position, thereby latching the riser cage to the information processing device and disengages from the anchor in response to the slider translating to the second position to unlatch the riser cage.

In some examples, the slider includes a first latching element and a second latching element configured to engage with a first anchor and a second anchor, respectively, of the information processing device in the fastened state (i.e., in response to the slider translating to the first position), thereby fastening the riser cage assembly to the information processing device. Similarly, the first and second latching elements are disengaged from the first and second anchors, respectively, in the unfastened state (i.e., in response to the slider translating to the second position), thereby releasing the riser cage bracket from the information processing device. In some examples, the first latching element is positioned adjacent one end of the riser cage bracket and the second latching element is positioned adjacent an opposite end of the riser cage bracket, and thus a single latching assembly can secure both ends of the riser cage bracket to the information processing device. Moreover, in such examples, both ends of the riser cage bracket can be latched and unlatched by actuation of the same single lever.

Since the latching assembly of the present disclosure is operable merely by pushing the lever or pulling the lever and without requiring grasping the knob or handle of the fasteners as in the case of a conventional locking assembly, the latching assembly of the present disclosure may be easily operable even in an information processing device that has space constraints. Furthermore, since the latching assembly is operable without grasping the lever, there is no requirement for lateral free space around the lever, and hence the latching assembly may be easily deployed and operated in the information processing device having space constraints. Additionally, since the latching assembly is attached to the riser cage bracket, the chances of losing the latching assembly during maintenance or replacement activities can be avoided. Accordingly, performing the maintenance or replacement activities of the riser cage assembly may not be a time-consuming and laborious activity, as it was previously while using the fasteners of the conventional locking assembly to fasten or release the riser cage assembly from the information processing device.

In some examples, the riser cage bracket has a bracket side portion and a bracket window portion coupled perpendicularly to the bracket side portion such that a space is defined between the bracket side portion and the bracket window portion, which can receive an expansion card and detachably connect the expansion card to a riser card mounted on and coupled to the bracket side portion. Moreover, in some examples the lever is rotatably coupled to the bracket side portion and the slider is movably coupled to the lever and the bracket side portion. The slider extends parallel to a longitudinal dimension of the bracket side portion. As noted above, in some examples, the slider includes a first latching element and a second latching element, and in some of these examples the first latching element is positioned adjacent to a distal end of the slider while the second latching element is positioned adjacent to a proximal end of the slider.

Referring to the Figures, FIG. 1 depicts a block diagram of an information processing device 100 having a chassis 102, a primary system board 104, one or more anchors (e.g., a first anchor 106, and a second anchor 108), and a riser cage assembly 110. The information processing device 100 may be a computer (e.g., a server, a storage device), a networking device (e.g., a switch, an access point), or the like.

The chassis 102 is an enclosure that can receive and support various components of the information processing device 100 such as the primary system board 104, the first anchor 106, the second anchor 108, and the riser cage assembly 110. The primary system board 104 is a main circuit board of the information processing device 100 that includes a variety of components such as a power conversion circuitry, one or more processor sockets to receive one or more processing resources (not shown, e.g., CPU, GPU, or the like), one or more memory sockets to receive memory devices, electrical and communications interconnects and busses, various controllers, chipsets (such as a baseboard management controller (BMC)), or the like. In some examples, the primary system board 104 is a motherboard or a host platform module. In the example of FIG. 1, the primary system board 104 is the host platform module, which is mounted on and coupled to the chassis 102. In certain examples, the primary system board 104 may include a substrate 104A, the one or more processing resources mounted on and coupled to the substrate 104A via the one or more processor sockets, a connector 112 (e.g., an expansion slot) disposed on and coupled to the substrate 104A, and traces (not shown) formed in the substrate 104A such that the traces are connected to the one or more processing resources and the connector 112.

As noted above, the information processing device 100 includes one or more anchors. In some examples, the one or more anchors includes a first anchor 106. In some examples, the one or more anchors further includes a second anchor 108. In some examples, the one or more anchors further includes an additional anchor (not illustrated). Further, each of the one or more anchors (e.g., first anchor 106 and the second anchor 108) is a retention component that can engage with a corresponding complementary retention component (e.g., a first latching element 140 and a second latching element 142) of the riser cage assembly 110 to secure the riser cage assembly 110 to the information processing device 100. In some examples, the anchors (e.g., the first anchor 106 and the second anchor 108) may be brackets, locking spools, or the like. In the example of FIG. 1, each of the anchors is disposed on and coupled to the chassis 102. However, in some other examples, the anchors may be disposed on and coupled to the primary system board 104, without limiting the scope of the present disclosure. In some examples in which both a first anchor 106 and a second anchor 108 are provided, the first anchor 106 is disposed proximate to a distal end 110A of the riser cage assembly 110 and the second anchor 108 is disposed proximate to a proximal end 110B of the riser cage assembly 110.

In some examples, the riser cage assembly 110 is a component mounting assembly that can house one or more electronic components and allow addition of such one or more electronic components to the primary system board 104 to expand the capability or functionality of the information processing device 100. In certain examples, the riser cage assembly 110 includes a riser cage bracket 114, a latching assembly 116, a riser card 118, and (optionally) an expansion card 120.

The riser cage bracket 114 is a structural support component that provides support to the riser card 118 and the expansion card 120 and secures such cards to the information processing device 100. In some examples, the riser cage bracket 114 includes a bracket side portion 122 and a bracket window portion 124 which are coupled to each other at a right angle to define a space (e.g., volume 126) therebetween. In other words, the bracket side portion 122 is coupled perpendicularly to the bracket window portion 124 such that the volume 126 is defined between the bracket side portion 122 and the bracket window portion 124. In such examples, the riser card 118 may be coupled to the bracket side portion 122 and the expansion card 120 may be disposed in the volume 126 and coupled to the riser cage bracket 114. In some examples, the riser cage bracket 114 further includes a cover portion (not illustrated) which is coupled to both the bracket side portion 112 and the bracket window portion 124 and oriented transverse (perpendicular) to both; in such examples, the volume 126 is bounded on three sides by the bracket side portion 112, the bracket window portion 124, the cover portion.

In some examples, the riser cage bracket 114 having the riser card 118 mounted therein, may be disposed on the primary system board 104 to install the riser cage assembly 110 to the information processing device 100. In particular, when the riser cage bracket 114 is disposed on the primary system board 104, a first connector 128 of the riser card 118 is detachably connected to the connector 112 of the primary system board 104. Further, the expansion card 120 is disposed in the volume 126 of the riser cage bracket 114 such that an expansion connector 132 of the expansion card 120 is detachably connected to a second connector 130 of the riser card 118. Accordingly, when the expansion card 120 is detachably connected to the riser card 118, electrical signals from the expansion card 120 can be transferred to the primary system board 104 via the riser card 118.

The latching assembly 116 is a locking assembly of the riser cage assembly 110 that when actuated in one direction (e.g., pushed) may fasten the riser cage bracket 114 to the information processing device 100 or when actuated in another direction (e.g., pulled) may release the riser cage bracket 114 from the information processing device 100. In certain examples, the latching assembly 116 includes a lever 134 and a slider 136 which are mounted to (or attached to) the riser cage bracket 114. In particular, the lever 134 is rotatably coupled to the bracket side portion 112 and the slider 136 is movably coupled to the lever 134 and the bracket side portion 122. In such examples, the slider 136 may extend parallel to a longitudinal dimension of the bracket side portion 122. The slider 126 includes one or more latching elements; in FIG. 1 two latching elements are illustrated in the form of a first latching element 140 adjacent to a distal end 136A of the slider 136 and a second latching element 142 adjacent to a proximal end 136B of the slider 136. In certain examples, the first latching element 140 may be one of a hook or a tab, and the second latching element 142 may be the tab. In one or more examples, the lever 134 may be actuated by an application of force (e.g., pushed or pulled) to drive the slider 136 to translate horizontally relative to the bracket side portion 122 between a first position corresponding to a fastened state of the latching assembly 116 and a second position corresponding to an unfastened state of the latching assembly 116. More specifically, actuation of the lever 134 causes the lever 134 to pivot about a support (bracket side portion 122) which rotatably couples the lever 134 to the bracket side portion 112, and the lever 134 is coupled to the slider 136 such that the pivoting motion of the lever 134 is converted into translational motion of the slider 136.

In some examples, in an installed state of the riser cage assembly 110 in the information processing device 100, the lever 134 may be pivoted in one direction to drive the slider 136 along a first direction 10 to cause the latching elements to engage with the anchors and thereby fasten the riser cage assembly 110 to the information processing device 100. The state of the latching assembly 116 in which the latching elements are engaged with the anchors may be referred to as a fasted state. In examples in which the first and second latching elements 140, 142 and the first and second anchors 106, 108 and a provided, in the fastened state the first latching element 140 and the second latching element 142 of the slider 136 engage with the first anchor 106 and the second anchor 108, respectively. In some examples, the pivoting of the lever 134 to drive the slider along the first direction 10 may be accomplished by the user applying a force to (e.g., pushing) a free end of the lever so as to cause causing the lever 134 to pivot towards the primary system board 104.

Conversely, in the installed state of the riser cage assembly 110 in the information processing device 100, the lever 134 may be pivoted in the opposite direction to drive the slider 136 along a second direction 20 opposite to the first direction 10 to cause the latching elements to disengage from the anchors and thereby release the riser cage assembly 110 from the information processing device 100. The state of the latching assembly 116 in which the latching elements are disengaged from the anchors may be referred to as an unfasted state. In examples in which the first and second latching elements 140, 142 and the first and second anchors 106, 108 and a provided, in the unfastened state the first latching element 140 and the second latching element 142 of the slider 136 disengage from the first anchor 106 and the second anchor 108, respectively. In some examples, the pivoting of the lever 134 to drive the slider along the second direction 20 may be accomplished by the user applying a force to (e.g., pulling) a free end of the lever so as to cause causing the lever 134 to pivot away from the primary system board 104.

Since the latching assembly 116 is operable merely by pushing a free end of the lever 134 or pulling a free end of the lever 134 and without requiring grasping a knob or a handle of fasteners as in the case of a conventional locking assembly, the latching assembly of the present disclosure may be easily operable in the information processing device 100 that has space constraints. Furthermore, since the latching assembly 116 is operable without grasping the lever 134, there is no requirement for lateral free space around the lever 134, and hence the latching assembly 116 may be easily deployed and operated in the information processing device 100 having space constraints. Additionally, since the latching assembly 116 is attached to the riser cage bracket 114, the chances of losing the latching assembly 116 during maintenance or replacement activities can be avoided. Accordingly, performing the maintenance or replacement activities of the riser cage assembly 110 may not be a time-consuming and laborious activity, as it was previously while using the fasteners of the conventional locking assembly to fasten or release the riser cage assembly from the information processing device.

Figure 2A:
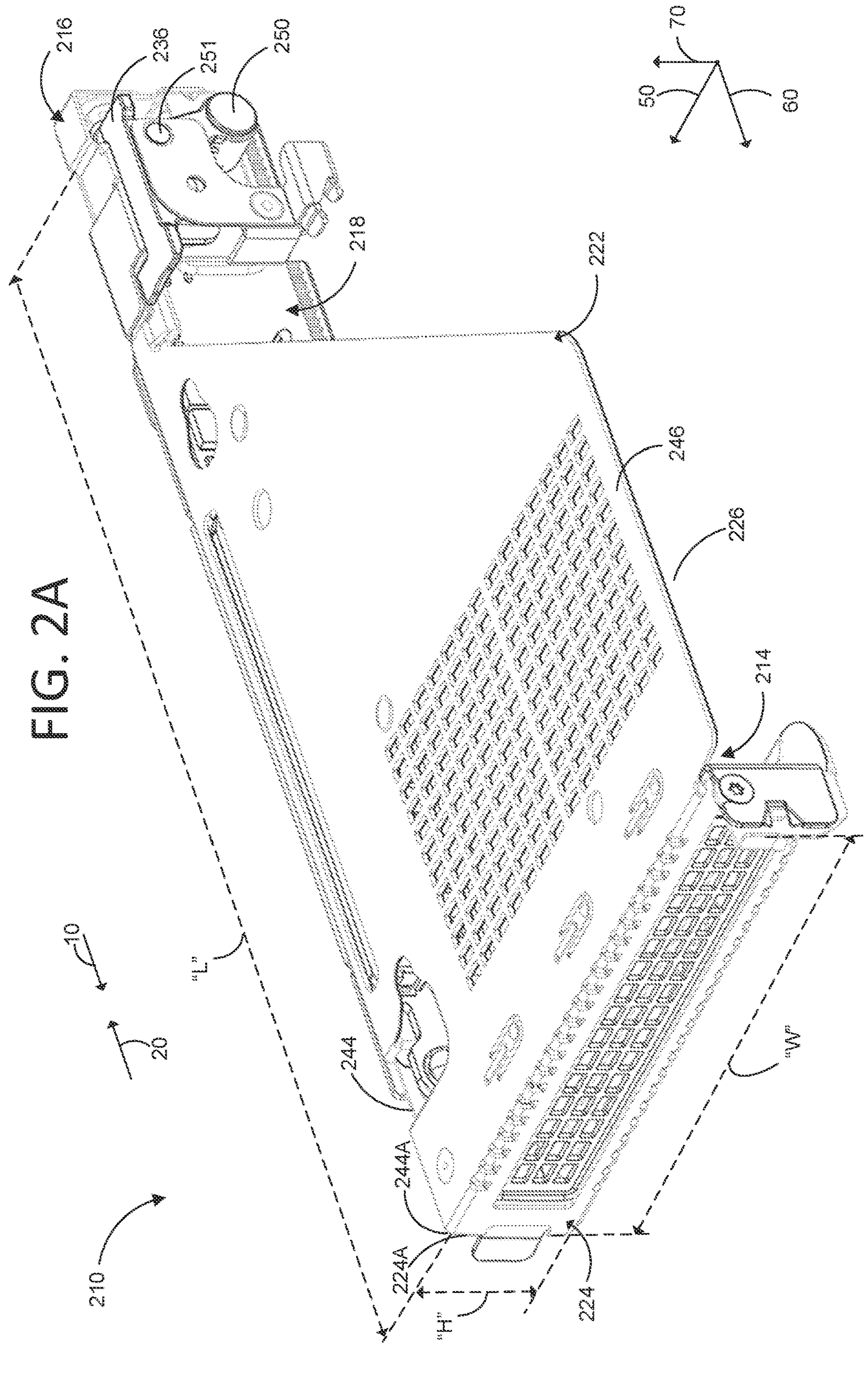
FIGS. 2A-2C illustrate perspective side views of a riser cage assembly having a riser cage bracket, a latching assembly, and a riser card according to an example of the present disclosure.
Figure 2B:
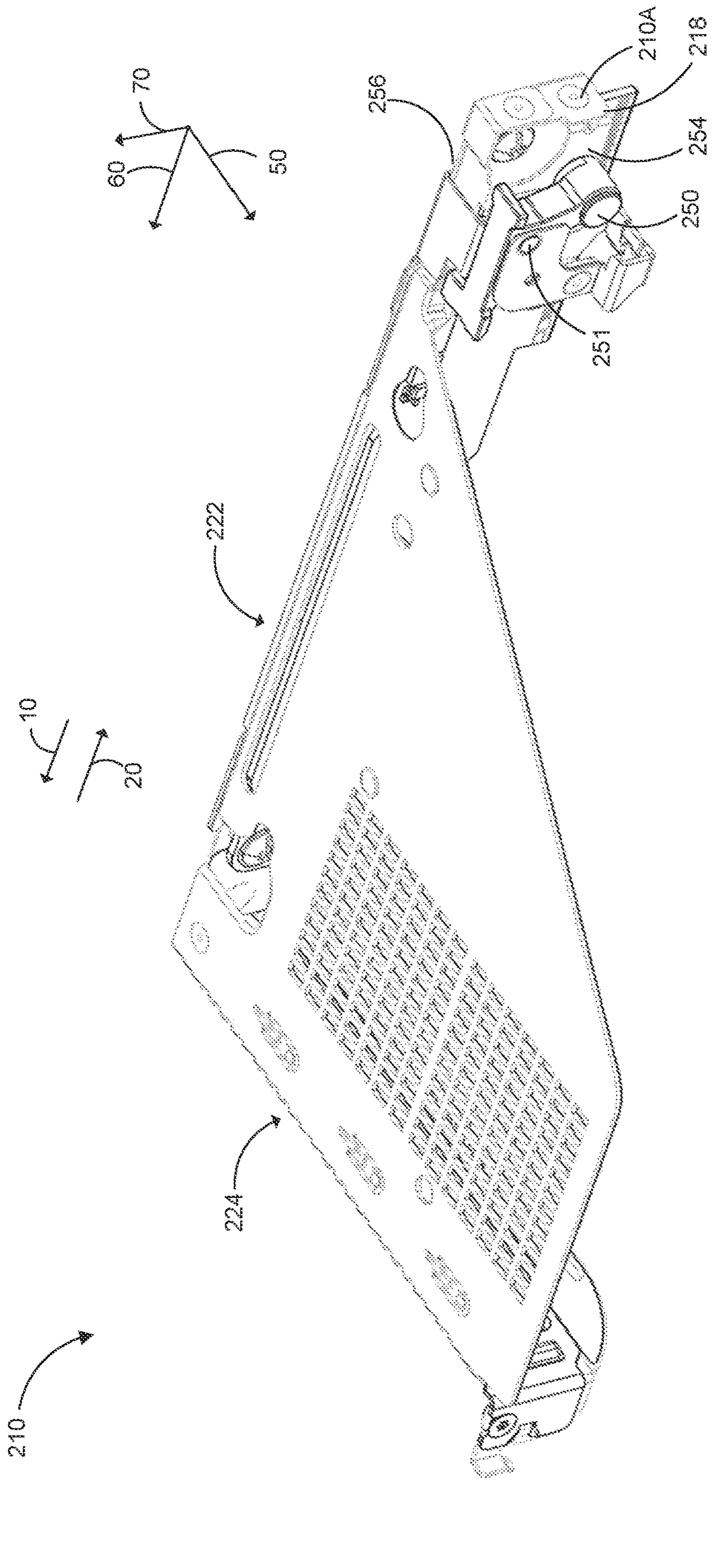
Figure 2C:
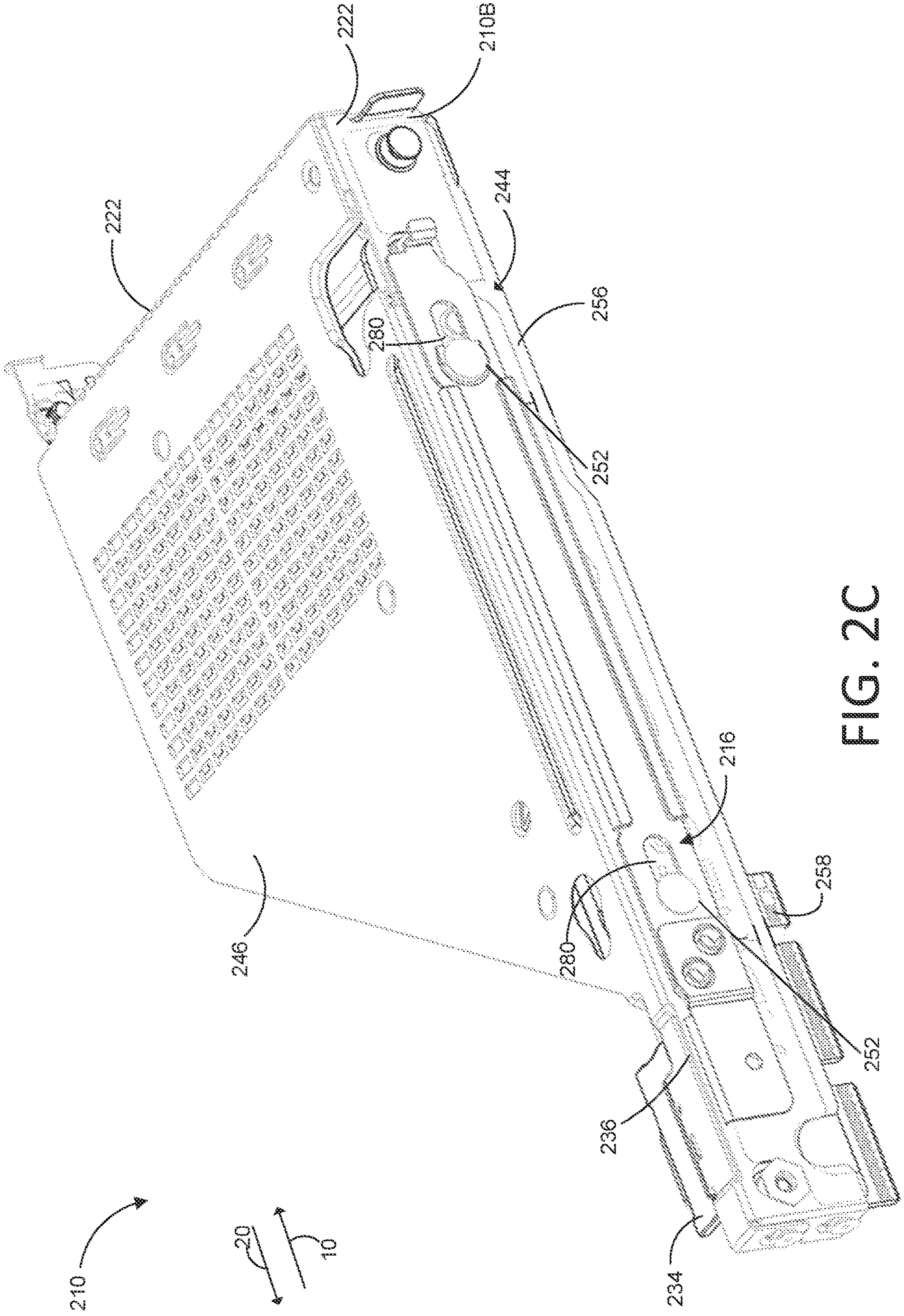

Referring to Figures, FIGS. 2A-2C depict perspective side views of a riser cage assembly 210. In the description hereinafter, FIGS. 2A-2C are described concurrently for ease of illustration.

Figure 5A:
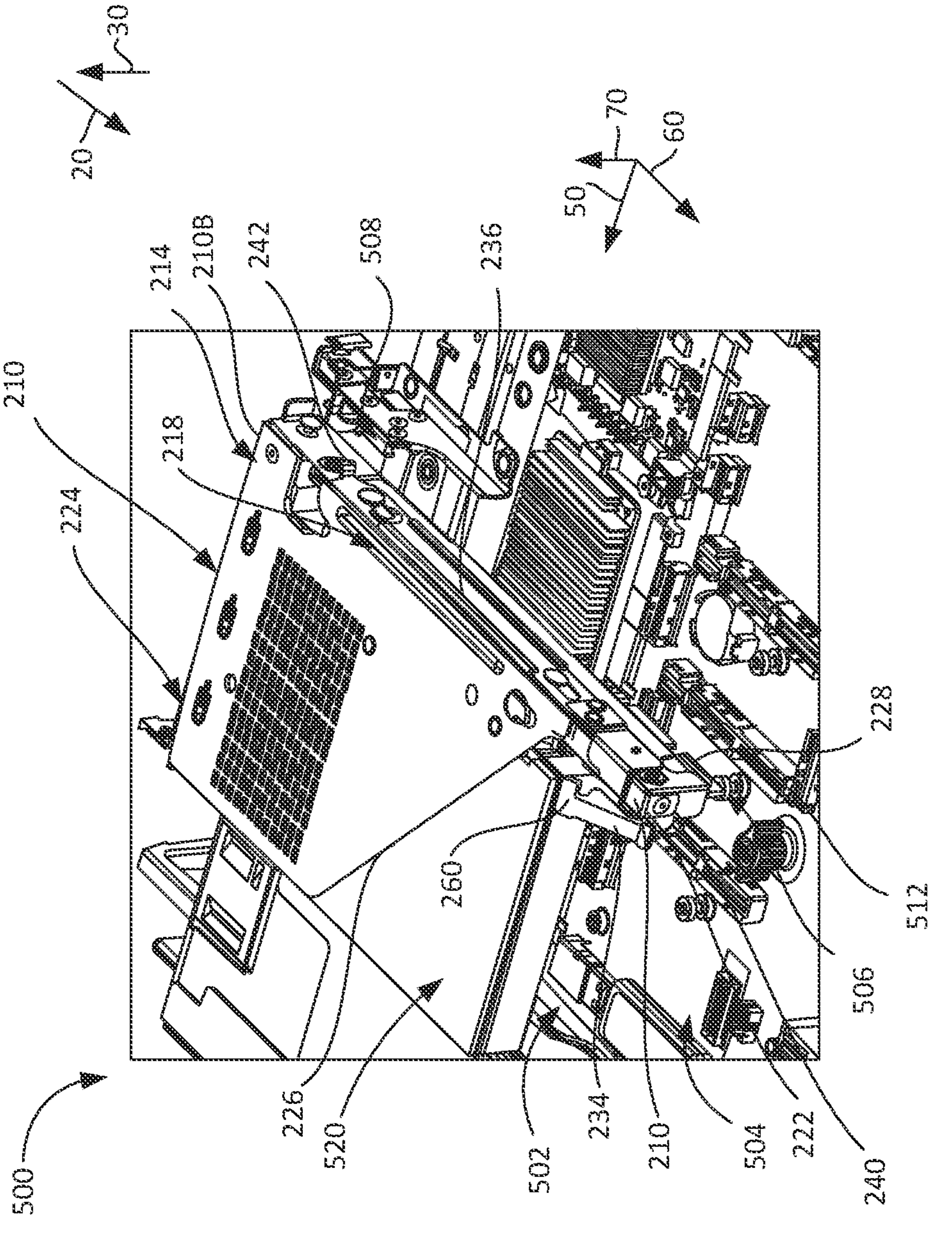
FIGS. 5A-5C illustrate a plurality of steps of transitioning the latching assembly from an unfastened state to a fastened state to fasten the riser cage assembly of FIGS. 2A-2C to an information processing device according to an example of the present disclosure.
Figure 5B:
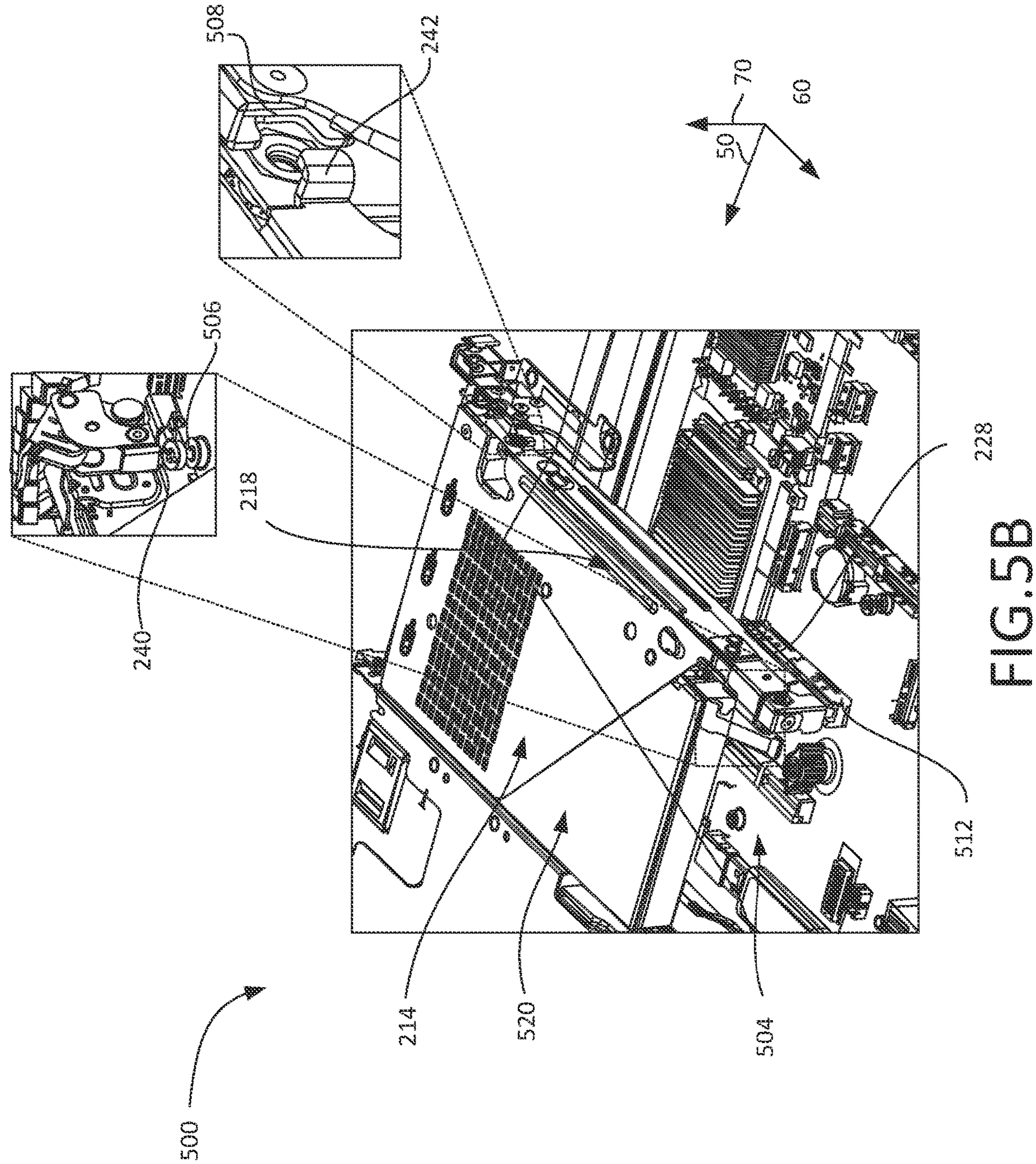
Figure 5C:
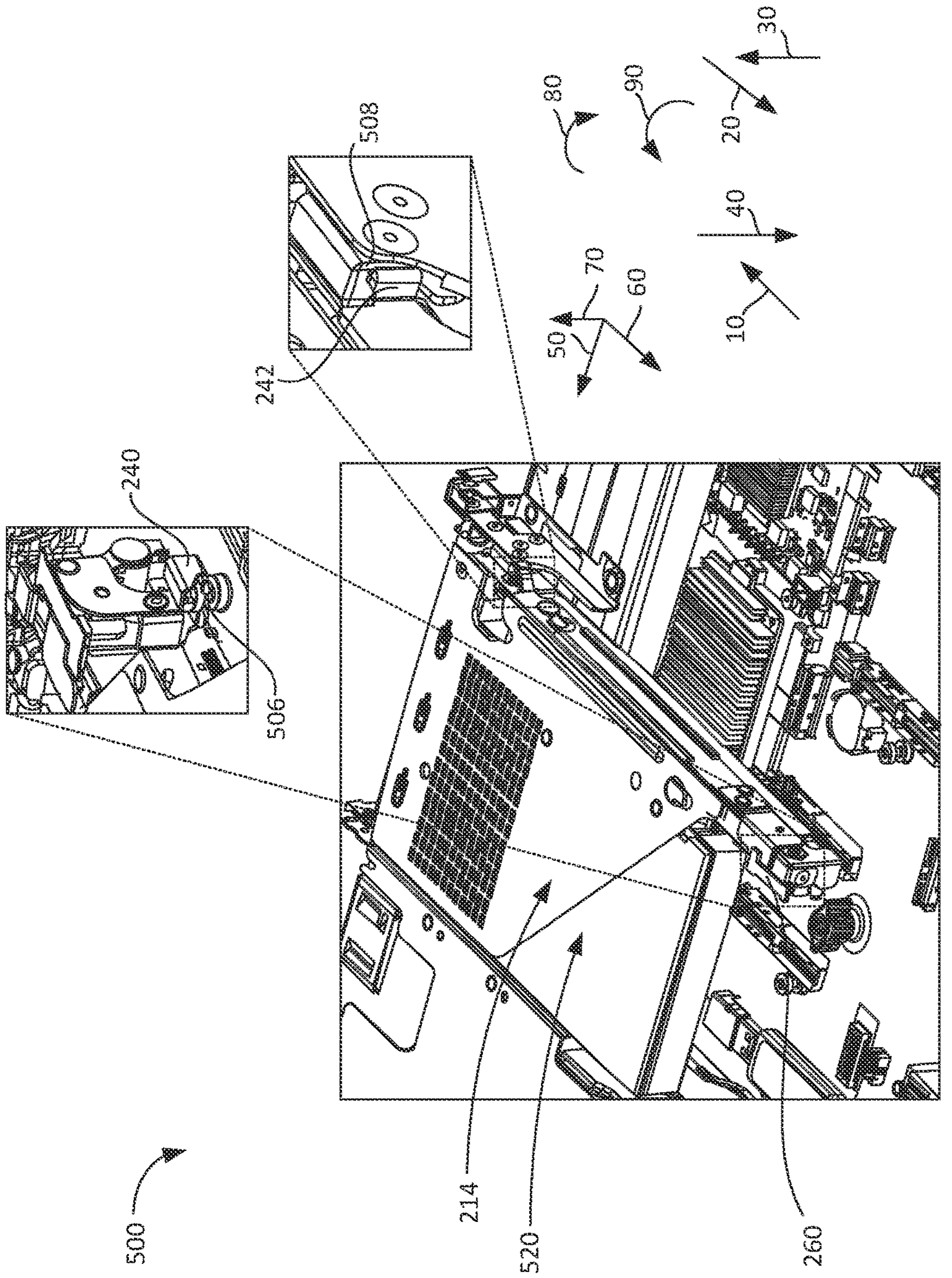

The riser cage assembly 210 may be a component mounting assembly that houses one or more electronic components and allow addition of the one or more electronic components to a primary system board 504 (as shown in FIGS. 5A-5C) to expand the capability or functionality of an information processing device 500 (as shown in FIGS. 5A-5C). The riser cage assembly 210 includes a riser cage bracket 214, a latching assembly 216, and a riser card 218. It may be noted herein that the riser cage assembly 210 may additionally include an expansion card 520 (as shown in FIGS. 5A-5C), without limiting the scope of the present disclosure.

The riser cage bracket 214 may be a support structure of the riser cage assembly 210. The riser cage bracket 214 includes a bracket side portion 222 and a bracket window portion 224. The bracket window portion 224 has a width "W", and a height "H". In some examples, the height "H" may be of a 1 Unit Space (U) height, and the width "W" may be equal to one of full-height or a low-profile of the expansion card 520. In an installed state of the riser cage assembly 210 in the information processing device 500, the bracket window portion 224 may extend perpendicularly to the primary system board 504 along a lateral dimension 50 of the information processing device 500. The bracket side portion 222 includes a sidewall 244 and a cover 246. The sidewall 244 has a length "L" and the height "H". In some examples, the height "H" may be of the 1 U height, and the length "L" may be equal to one of a full-length or a half-length of the expansion card 520. In the installed state of the riser cage assembly 210 in the information processing device 500, the sidewall 244 may extend perpendicularly to the primary system board 504 along a longitudinal dimension 60 of the information processing device 500. Additionally, the height "H" of the riser cage bracket 214 may be perpendicular to the primary system board 504 along a radial dimension 70 of the information processing device 500. In one or more examples, the sidewall 244 is disposed perpendicularly to the bracket window portion 224, and a first end 244A of the sidewall 244 is coupled to a first end 224A of the bracket window portion 224 such that a space 226 is defined between the bracket side portion 222 and the bracket window portion 224. In such examples, the cover 246 of the bracket side portion 222 is mounted on and coupled to the sidewall 244 and the bracket window portion 224 such that the cover 246 lids a portion the space 226. In one or more examples, the bracket side portion 222 further includes a first spool 250, a second spool 251, and a set of third spools 252, each spool extends perpendicularly to the longitudinal dimension 60 of the bracket side portion 222. In particular, the first spool 250 and the second spool 251 are disposed spaced apart from each other and extend perpendicularly from a first side 254 of the sidewall 244. Further, the first spool 250 and the second spool 251 are disposed proximate to a distal end 210A of the riser cage assembly 210. The set of third spools 252 includes one third spool 252A and another third spool 252A. In such examples, the third spools 252A, 252B are disposed spaced apart from each other and extend perpendicularly from a second side 256 of the sidewall 244. Further, the third spool 252A is disposed proximate to mid-region of the slider 236 and the other third spool 252A is disposed proximate to a proximal end 210B of the riser cage assembly 210.

The riser card 218 may be an electronic card of the information processing device 500. In some examples, the riser card 218 may be mounted on and coupled to the bracket side portion 222 using fasteners (not shown) that extend through fastening features (not labeled) formed in the sidewall 244 and the riser card 218. In some examples, the riser card 218 is first coupled to the sidewall 244 to get support from the riser cage bracket 214 and later the riser card 218 may be detachably connected to the primary system board 504. In particular, a first connector 258 (e.g., golden fingers) of the riser card 218 may be detachably connected to an expansion slot (not shown) of the primary system board 504, when the riser cage assembly 210 is installed in the information processing device 500. In some examples, the riser cage assembly 210 installed in the information processing device 500 may provision addition of one or more hardware components such as the expansion card 520 to the information processing device 500 to satisfy/expand further requirements or functionality of the information processing device 500. For example, the expansion card 520 may be disposed in the space 226 defined in the riser cage bracket 214 such that an expansion connector of the expansion card 520 is detachably connected to a second connector (not shown) of the riser card 218, and thereby enable an electrical connection between the expansion card 520 and the primary system board 504 via the riser card 218. In some examples, the expansion card 520 may be coupled to the bracket window portion 224 using fasteners (not shown) that extend through fastening features (not labeled) formed in the bracket window portion 224 and the expansion card 520.

The latching assembly 216 may be a locking assembly of the riser cage assembly 210, which may be used to secure the riser cage bracket 214 to the information processing device 500. In one or more examples, the latching assembly 216 includes a lever 234 and a slider 236 and is attached to the riser cage bracket 214. For example, the lever 234 is rotatably coupled to the bracket side portion 222 via the first spool 250. The slider 236 is movably coupled to the lever 234 via the second spool 251, and the slider 236 is further movably coupled to the bracket side portion 222 via the pair of third spools 252. The assembly of the lever 234 and the slider 236 to the riser cage bracket 214 are discussed in greater detail below. In one or more examples, the lever 234 may be configured to drive the slider 236 between a first position corresponding to a fastened state of the latching assembly 216 and a second position corresponding to an unfastened state of the latching assembly 216, as discussed in greater detail below.

Figure 3B:
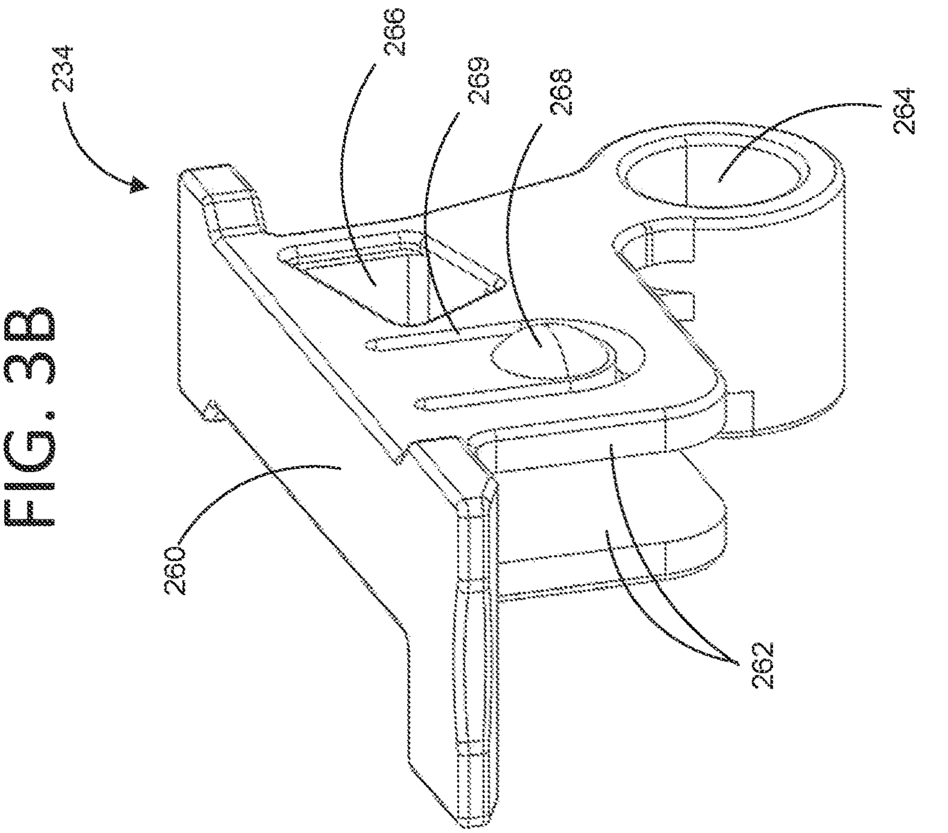
FIGS. 3A-3B illustrate an expanded perspective side views of a lever of the latching assembly of FIGS. 2A-2C according to an example of the present disclosure.
Figure 3A:
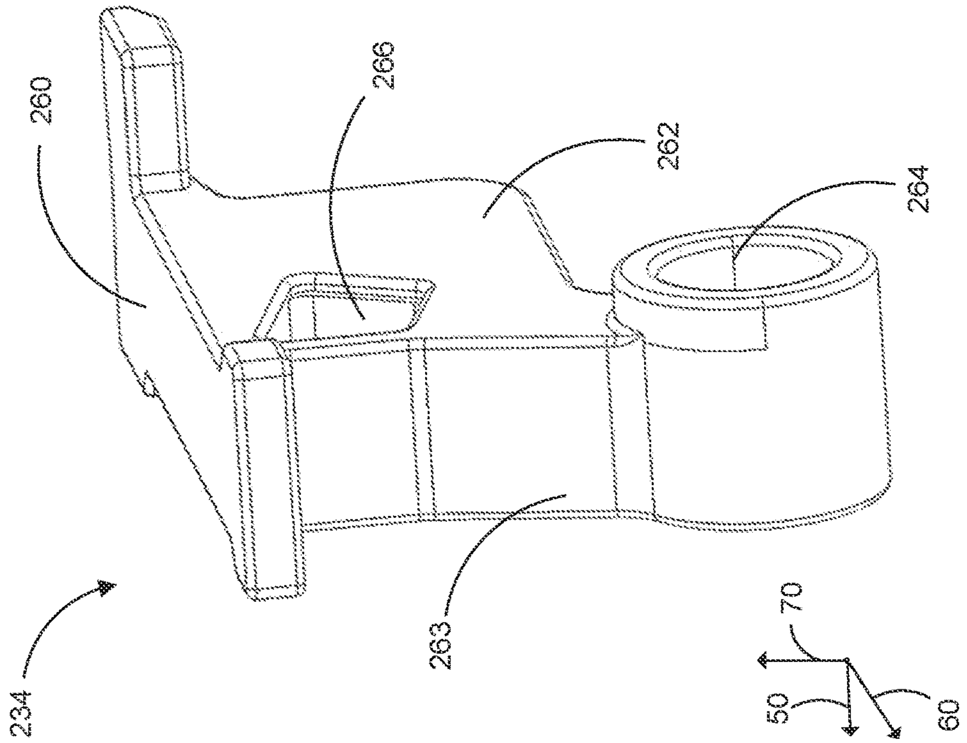

FIGS. 3A-3B depict perspective side views of a lever 234 of the latching assembly 216 of FIGS. 2A-2C and FIGS. 4A-4B depict perspective side views of a slider 236 of the latching assembly 216 of FIGS. 2A-2C. In the description hereinafter, FIGS. 3A-3B and 4A-4B are described concurrently for ease of illustration.

Figure 4B:
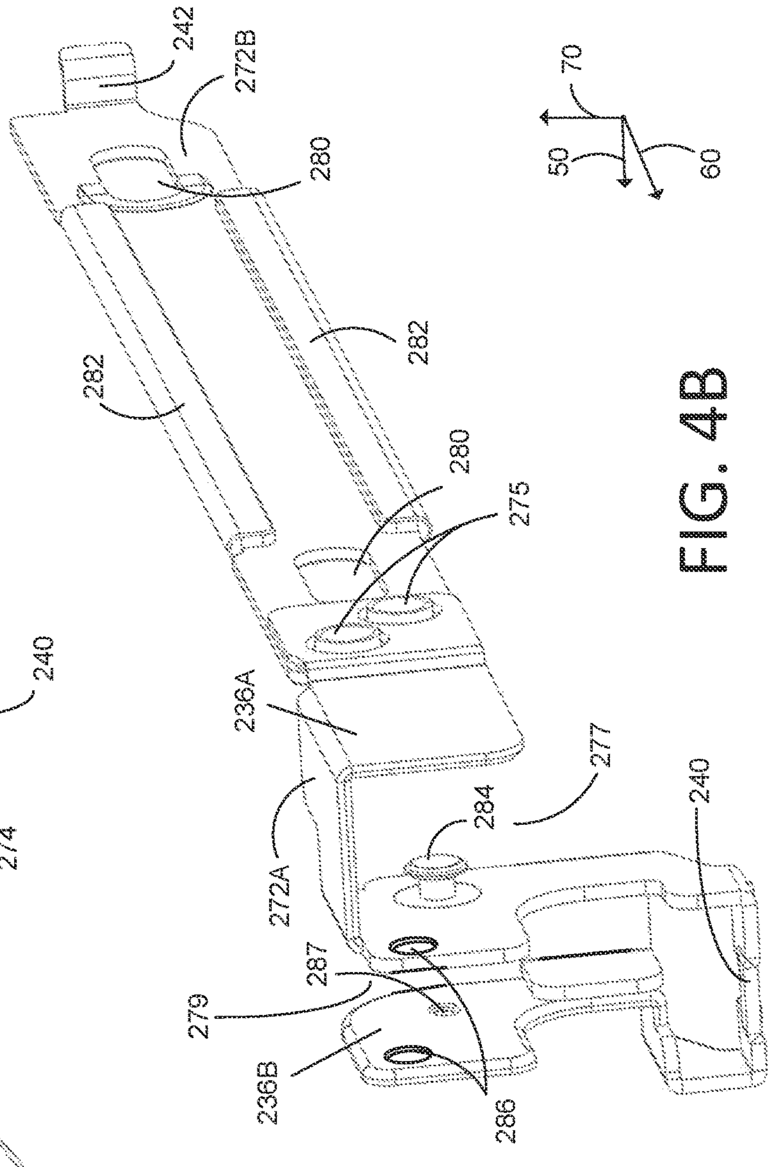
FIGS. 4A-4B illustrate an expanded perspective side views of a slider of the latching assembly of FIGS. 2A-2C according to an example of the present disclosure.
Figure 4A:
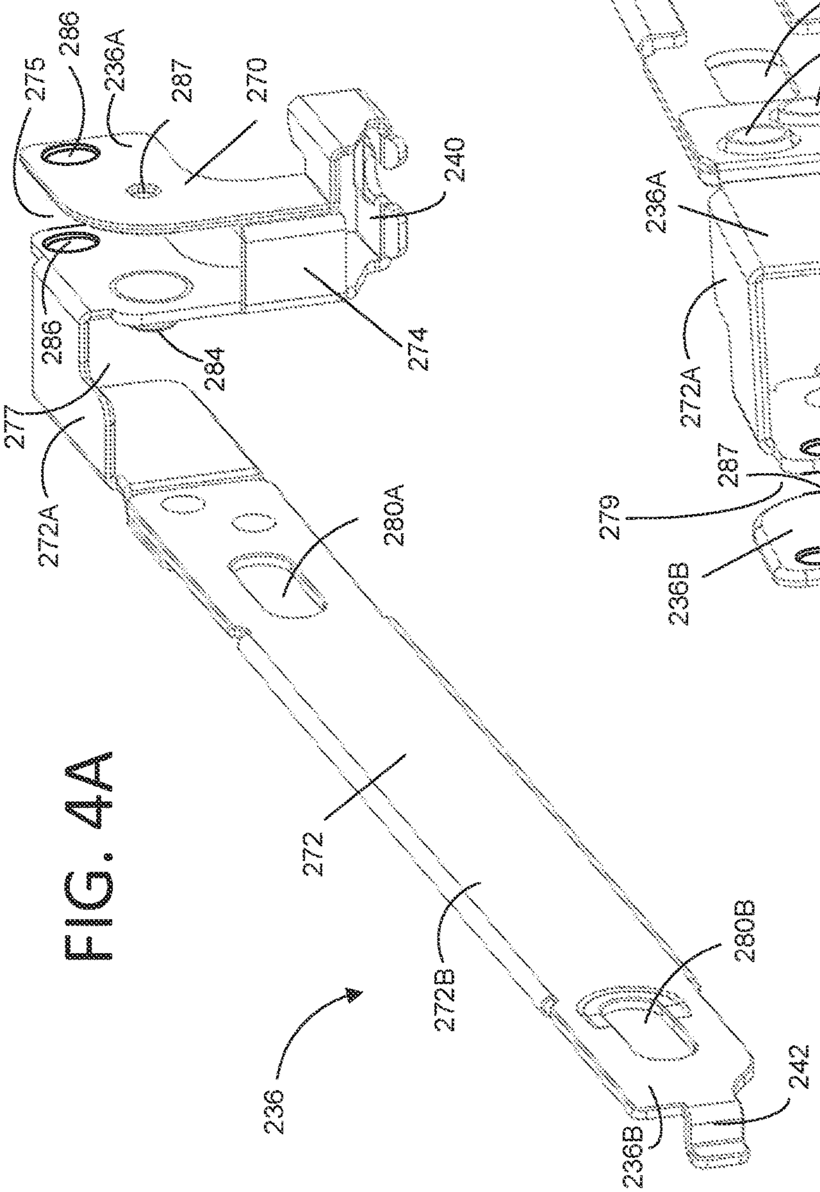

The lever 234 includes a handle 260 and a pair of arms 262 connected to the handle 260. The pair of arms 262 are disposed spaced apart from each other and one side of each arm of the pair of arms 262 are coupled to each other via a body portion 263. Further, each arm of the pair of arms 262 includes a first opening 264 and a guided slot 266. In the example of FIGS. 3A-3B, the guide slot 266 has a trapezoid profile. Further, at least one arm of the pair of arms 262 includes a protrusion 268 and a recess 269. In one or more examples, the first opening 264 in each of the pair of arms 262 may allow the lever 234 to be movably connected to the bracket side portion 222. Further, the guided slot 266 in each arm of the pair of arms 262 may allow the lever 234 to be movably coupled to the slider 236. The recess 269 is formed containing at least a portion of the protrusion 268 so as to allow the protrusion 268 to bend along a lateral dimension 50 of the riser cage assembly 210. Further, the protrusion 268 may engage with an aperture 287 (as shown in FIGS. 4A-4B) formed in the slider 236 to lock the lever 234 with the slider 236 in the fastened state of the latching assembly 216.

The slider 236 includes a first support wall 270 and a second support wall 272 disposed spaced apart from each other. The slider 236 further includes an intermediate wall 274 connected to the first and second support walls 270, 272 at a distal end 236A of the slider 236 to define a U-shaped profile between the first and second support walls 270, 272. The slider 236 having the U-shaped profile at the distal end 236A defines a lever mounting area 279 that allows mounting of the lever 234 on the slider 236. In some examples, the second support wall 272 includes a first portion 272A and a second portion 272B which are coupled to each other via a pair of fasteners 275. In such examples, the first portion 272A has an inverted U-shaped profile and the second portion 272B has a linear profile. The first portion 272A having the inverted U-shaped profile defines a bracket mounting area 277 to allow mounting of the riser cage bracket 214 on the bracket side portion 222. The second support wall 272 further includes a set of slots 280. In particular, the set of slots 280 are formed in the second portion 272B of the second support wall 272. For example, the set of slots 280 includes a first slot 280A disposed proximate to a mid-region of the slider 236 and the second slot 280B disposed proximate to a proximal end 236B of the slider 236. The second portion 272B of the second support wall 272 further includes a pair of retainer hooks 282 configured to slidably engage to the sidewall 244 of the bracket side portion 222. Further, each retainer hook of the pair of retainer hooks 282 is disposed facing the other one and located between the pair of slots 280. The second support wall 272 further includes a guide pin 284 that is configured to engage with a guide slot (not shown) formed in the sidewall 244 of the bracket side portion 222 so as to direct the slider 236 to move horizontally relative to the bracket side portion 222. In some examples, the second support wall 272 further includes an aperture 287 configured to engage with the protrusion 268 of the lever 234 to lock the lever 234 to the slider 236 in the fastened state of the latching assembly 216. Further, each of the first and second support walls 270, 272 includes a second opening 286 which may the bracket side portion 222 to movably couple with the slider 236 to the lever 234. In one or more examples, the distal end 236A of the first and second support walls 270, 272 includes a first latching element 240 and the proximal end 236B of the second support wall 272 includes a second latching element 242. In the example of FIGS. 4A-4B, the first latching element 240 is a hook and the second latching element 242 is a tab.

Referring to Figures, FIGS. 2A-2C, 3A-3B, and 4A-4C, the slider 236 is mounted on the sidewall 244 of the bracket side portion 222 such that the second portion 272B of the second support wall 272 extends parallel to a longitudinal dimension 60 of the bracket side portion 222. In particular, the first portion 272A of the second support wall 272 is mounted on the bracket mounting area 277 such that the guide pin 284 is engaged with the guide slot (not shown) disposed on the first side 254 of the sidewall 244, the second portion 272B of the second support wall 272 is disposed on the second side 256 of the sidewall 244, and the pair of retainer hooks 282 is slidably engage to the sidewall 244 to movably couple the slider 236 to the bracket side portion 222. Further, the lever 234 is disposed between the first and second support walls 270, 272. In particular, the lever 234 is mounted on the lever mounting area 279 such that the first spool 250 is engaged to the first opening 264 in each arm of the set of arms 262 of the lever 234 to rotatably couple the lever 234 to the bracket side portion 222. In the example of FIGS. 2A-2C, the lever 234 is positioned between the first support wall 270 and the first portion 272A of the second support wall 272. Further, the second spool 251 in the bracket side portion 222 extends between the second opening 286 in each wall of the first and second support walls 270, 272 and the guided slot 266 in each arm of the set of arms 262 of the lever 234 to movably couple the slider 236 to the lever 234. Further, the set of third spools 252 in the bracket side portion 222 is engaged to the set of slots 280 in the second support wall 272 to movably couple the slider 236 to the bracket side portion 222.

The lever 234 is actuatable to drive the slider 236 to translate horizontally relative to the bracket side portion 222 between a first position corresponding to a fastened state of the latching assembly 216 and a second position corresponding to an unfastened state of the latching assembly 216. It may be noted herein that the latching assembly 216 in the example of FIGS. 2A-2C is shown in the fastened state. In some examples, in an installed state of the riser cage assembly 210 in the information processing device 500, the handle 260 of the lever 234 may be pushed to drive the slider 236 along a first direction 10 to cause the first latching element 240 and the second latching element 242 of the slider 236 to engage with a first anchor 506 and the second anchor 508, respectively (as shown in FIGS. 5A-5B) and thereby fasten the riser cage assembly 210 to the information processing device 500 and translate the latching assembly 216 to the fastened state. Similarly, in the installed state of the riser cage assembly 210 in the information processing device 500, the handle 260 of the lever 234 may be pulled to drive the slider 236 along a second direction 20 opposite to the first direction 10 to cause the first latching element 240 and the second latching element 242 of the slider 236 to disengage from the first anchor 206 and the second anchor 208, respectively, and thereby release the riser cage assembly 210 from the information processing device 500 and translate the latching assembly to the unfastened state. In the example of FIGS. 2A-2C, each of the first direction 10 and the second direction 20 corresponds to longitudinal dimension 60 of the information processing device 500. The process of translating the latching assembly 216 between the fastened state and the unfastened state to fasten and release, respectively, the riser cage assembly 210 to the information processing device 500 is discussed in greater detail below.

FIGS. 5A-5C depict a portion of an information processing device 500 and a plurality of steps to transition the latching assembly 216 of FIGS. 2A-2C from an unfastened state to a fastened state so as to fasten the riser cage assembly 210 of FIGS. 2A-2C to the information processing device 500. The information processing device 500 may be a computer (e.g., a server, a storage device), a networking device (e.g., a switch, an access point), or the like. In one or more examples, the information processing device 500 includes a chassis 502, a primary system board 504, a first anchor 506, a second anchor 508, and a riser cage assembly 210.

The chassis 502 is an enclosure that receives and supports various components of the information processing device 500 such as the primary system board 504, the first anchor 506, the second anchor 508, and the riser cage assembly 510. The primary system board 504 is a main circuit board of the information processing device 500. In the example of FIGS. 5A-5C, the primary system board 504 is a host platform module, which is mounted on and coupled to the chassis 502. The primary system board 504 includes a connector 112 (e.g., an expansion slot) that is configured to receive and detachably connect to a first connector 228 of a riser card 518. Further, each of the first anchor 506 and the second anchor 508 is a retention component that can engage with a corresponding complementary retention component (e.g., a first latching element 240 and a second latching element 242, respectively) of the riser cage assembly 210 to secure the riser cage bracket 214 to the information processing device 500. In some examples, the first anchor 506 is a locking spool and the second anchor 508 is a bracket. Each of the first anchor 506 and the second anchor 508 is disposed on and coupled to the chassis 502 via the primary system board 504. In some examples, the first anchor 506 is disposed at a distal end 210A of the riser cage assembly 210 and the second anchor 508 is disposed at a proximal end 210B of the riser cage assembly 210.

In some examples, the riser cage assembly 210 is a component mounting assembly that is configured to house one or more electronic components and add such one or more electronic components to the primary system board 504 so as to expand the capability or functionality of the information processing device 500. In certain examples, the riser cage assembly 210 includes a riser cage bracket 214, a latching assembly 216, a riser card 218, and an expansion card 520. The riser cage bracket 214 is a structural support component that provides support to the riser card 218 and the expansion card 520 and additionally secures such cards to the information processing device 500. In some examples, the riser cage bracket 214 includes a bracket side portion 222 and a bracket window portion 224 coupled perpendicularly to the bracket side portion 222 such that a space 226 is defined between the bracket side portion 222 and the bracket window portion 224. In such examples, the riser card 218 is coupled to the bracket side portion 222, and the expansion card 520 is disposed within the space 226 to detachably connect with the riser card 218. In particular, when the expansion card 520 is disposed within the space 226, an expansion connector (not shown) of the expansion card 520 is detachably connected to a second connector (not shown) of the riser card 218 to enable an electrical connection between the expansion card 520 and the riser card 218. Further, the expansion card 520 may be secured to the riser cage assembly 210 by coupling it to the bracket window portion 224. The latching assembly 216 is a locking assembly of the riser cage assembly 210 that when actuated e.g., pushed may fasten the riser cage bracket 214 to the information processing device 500 or e.g., pulled may release the riser cage bracket 214 from the information processing device 500. In certain examples, the latching assembly 216 includes a lever 234 and a slider 236 which are attached to the riser cage bracket 214. In some examples, the lever 234 is rotatably coupled to the bracket side portion 222 and the slider 236 is movably coupled to the lever 234 and to the bracket side portion 222, thereby pre-installing the latching assembly 216 to the riser cage bracket 214. In particular, the slider 236 is disposed on the bracket side portion 222 such that the slider 236 extends parallel to a longitudinal dimension 60 of the bracket side portion 222 and movably coupled to the bracket side portion 222. Further, the lever 234 is disposed on the slider 236 such that the lever 234 is movably coupled to the slider 236 and rotatably coupled to the bracket side portion 222. In such examples, the lever 234 may be actuated by an application of force (e.g., pushed or pulled) to drive the slider 236 to translate horizontally relative to the bracket side portion 222 between a first position corresponding to the fastened state of the latching assembly 216 and a second position corresponding to the unfastened state of the latching assembly 216. In the example of FIGS. 5A-5B, the latching assembly 216 is shown in the unfastened state. In particular, the lever 234 is pulled along a third direction 30 causing the slider 236 to translate along a second direction 20 and disengage the first and second latching elements 240, 242 to disengage from the first and second anchors 506, 508, and thereby move the latching assembly 216 to the unfastened state. It may be noted herein that the third direction 30 may correspond to the radial orientation 70 of the riser cage assembly 210 and the second direction 20 may correspond to the longitudinal dimension 60 of the riser cage assembly 210.

Referring to FIG. 5A, in particular, the riser cage bracket 214 having the riser card 218 mounted therein and the expansion card 520 disposed within the space 226 and detachably connected to the riser card 218, may be mounted on the primary system board 504 to install the riser cage assembly 210 to the information processing device 500. Referring to FIG. 5B, in particular, as the riser cage bracket 214 is mounted on the primary system board 504, a first connector 228 of the riser card 218 is detachably connected to the connector 512 of the primary system board 504. Accordingly, the expansion card 520 is electrically connected to the primary system board 504 via the riser card 218. Further, when the riser cage bracket 214 is mounted on the primary system board 504, the first latching element 240 is disposed adjacent to the first anchor 506 and the second latching element 242 is disposed adjacent to the second anchor 508.

Now referring to FIGS. 5C, 3A-3B, and 4A-4B, the latching assembly 216 may be actuated to secure the riser cage assembly 210 to the information processing device 500. For example, a handle 260 of the lever 234 is actuated along a fourth direction 40 opposite to the third direction 30 to fasten the riser cage assembly 210 to the information processing device 500. In particular, the handle 260 of the lever 234 is pushed to drive the slider 236 along the first direction 10 so as to cause the first latching element 240 to engage with the first anchor 506 and the second latching element 242 to engage with the second anchor 508, thereby fasten the riser cage assembly 210 to the chassis 502 of the information processing device 500 and translate the latching assembly 216 to the fastened state. In some examples, as the lever 234 is pushed along the fourth direction 40, the first spool 250 of the bracket side portion 222 engaged to the first opening 264 of the lever 234 causes the lever 234 to rotate along a clockwise direction 80. Simultaneously, the second spool 251 of the bracket side portion 222 engaged to the guided slot 266 of the lever 234 and the second opening 286 of the slider 236 causes the lever 234 to guide the slider 236 to move (translate) along the first direction 10. It may be noted herein that the first direction 10 corresponds to the longitudinal dimension 60 of the riser cage assembly 210 and the fourth direction 40 corresponds to the radial orientation 70 of the riser cage assembly 210. Further, the set of third spools 252 of the bracket side portion 222 engaged to the set of slots 280 of the slider 236 directs the slider 236 to move horizontally along the first direction 10 relative to the bracket side portion 222. In such examples, the guide pin 284 of the slider 236 engaged to the guide slot (not shown) of the bracket side portion 222, and the pair of retainer hooks 282 of the slider 236 slidably engaged to the bracket side portion 222 guides the slider 236 to move horizontally relative to the bracket side portion 222. Thus, the movement of the slider 236 along the first direction 10 causes the first latching element 240 to engage with the first anchor 506 and the second latching element 242 to engage with the second anchor 508 and thereby fasten the riser cage assembly 210 to the information processing device 500. Further, the protrusion 268 of the lever 234 may engage with the aperture 287 of the slider 236 to lock the lever 234 with the slider 236 in the fastened state of the latching assembly 216.

In some examples, the latching assembly 216 may be actuated further to release the riser cage assembly 210 from the information processing device 500. For example, the handle 260 of the lever 234 may be actuated along the third direction 30 to release the riser cage assembly 210 from the information processing device 500. In particular, the handle 260 of the lever 234 may be pulled to drive the slider along the second direction 20 so as to cause the first latching element 240 to disengage from the first anchor 506 and the second latching element 242 to disengage from the second anchor 508, thereby release the riser cage assembly 210 from the chassis 502 of the information processing device 500 and translate the latching assembly 216 to the unfastened state. In some examples, as the lever 234 is pulled along the third direction 30, the first spool 250 of the bracket side portion 222 engaged to the first opening 264 of the lever 234 causes the lever 234 to rotate along an anti-clockwise direction 90. Simultaneously, the second spool 251 of the bracket side portion 222 engaged to the guided slot 266 of the lever 234 and the second opening 286 of the slider 236 causes the lever 234 to guide the slider 236 to move (translate) along the second direction 20. It may be noted herein that the second direction 20 corresponds to the longitudinal dimension 60 of the riser cage assembly 210 and the third direction 30 corresponds to the radial orientation 70 of the riser cage assembly 210. Further, the set of third spools 252 of the bracket side portion 222 engaged to the set of slots 280 of the slider 236 directs the slider 236 to move horizontally along the second direction 20 relative to the bracket side portion 222. In such examples, the guide pin 284 of the slider 236 engaged to the guide slot (not shown) of the bracket side portion 222, and the pair of retainer hooks 282 of the slider 236 slidably engaged to the bracket side portion 222 guides the slider 236 to move horizontally relative to the bracket side portion 222. Thus, the movement of the slider 236 along the second direction 20 causes the first latching element 240 to disengage from the first anchor 506 and the second latching element 242 to disengage from the second anchor 508 and thereby release the riser cage assembly 210 from the information processing device 500.

Since the latching assembly 216 is operable merely by pushing the lever 234 or pulling the lever 234 and without requiring grasping a knob or a handle of fasteners as in the case of a conventional locking assembly, the latching assembly of the present disclosure may be easily operable in the information processing device 500 that has space constraints. Furthermore, since the latching assembly 216 is operable without grasping the lever 234, there is no requirement for lateral free space around the lever 234, and hence the latching assembly 216 may be easily deployed and operated in the information processing device 500 having space constraints. Additionally, since the latching assembly 216 is attached to the riser cage bracket 214, the chances of losing the latching assembly 216 during maintenance or replacement activities can be avoided. Accordingly, performing the maintenance or replacement activities of the riser cage assembly 210 may not be a time-consuming and laborious activity, as it was previously while using the fasteners of the conventional locking assembly to fasten or release the riser cage assembly from the information processing device.

Figures 6A, 6B:
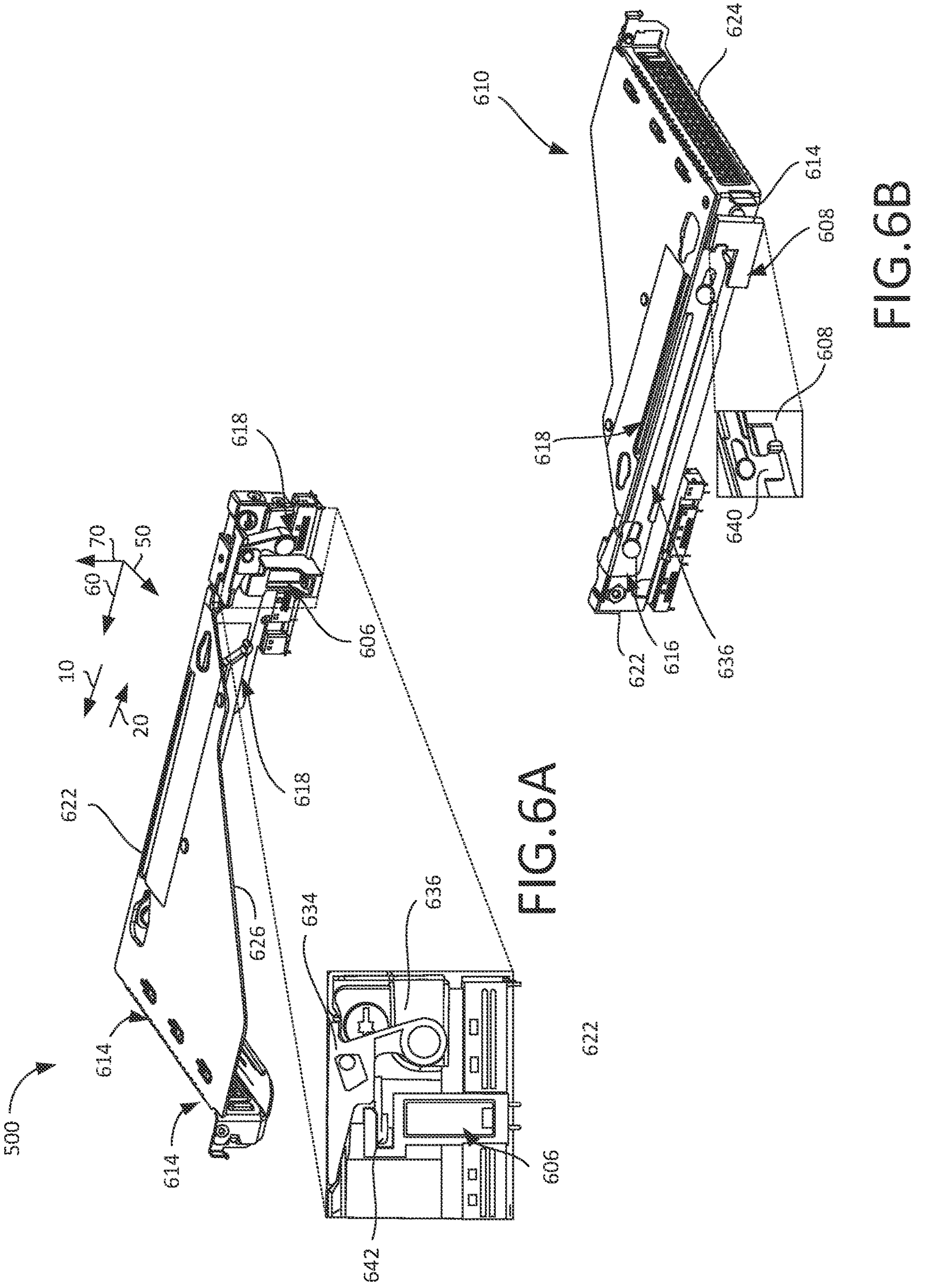
FIGS. 6A-6B illustrate perspective side views of a riser cage assembly having a first latching element coupled to a first anchor and a second latching element coupled to a second anchor according to another example of the present disclosure.

FIGS. 6A-6B depict perspective side views of a first anchor 606, a second anchor 608, and a riser cage assembly 610. In one or more examples, each of the first anchor 606 and the second anchor 608 is a retention component. In the example of FIGS. 6A-6B, each of the first anchor 606 and the second anchor 608 is a bracket. Further, each of the first anchor 106 and the second anchor 108 may be disposed on and coupled to a primary system board (not shown) of the information processing device. The riser cage assembly 610 includes a riser cage bracket 614, a latching assembly 616, a riser card 618, and an expansion card (not shown). The riser cage assembly 610 is configured to provide support to the riser card 618 and the expansion card and secure such cards to an information processing device. In some examples, the riser cage bracket 614 includes a bracket side portion 622 and a bracket window portion 624 which are coupled to each other at a right angle to define a space 626 is defined between the bracket side portion 622 and the bracket window portion 624. In such examples, the riser card 618 may be coupled to the bracket side portion 622 and the expansion card may be disposed in the space 626 and coupled to the bracket window portion 624. In some examples, the riser cage bracket 614 having the riser card 618 mounted therein, may be disposed on a primary system board (not shown) of the information processing system to install the riser cage assembly 610 to the information processing device. The latching assembly 616 is a locking assembly of the riser cage assembly 610, which when actuated (e.g., pushed) may fasten the riser cage bracket 614 to the information processing device or (e.g., pulled) may release the riser cage bracket 614 from the information processing device. In certain examples, the latching assembly 616 includes a lever 634 and a slider 636 which are attached to the riser cage bracket 614. In particular, the lever 634 is rotatably coupled to the bracket side portion 622 and the slider 636 is movably coupled to the lever 634 and the bracket side portion 622 (as discussed in the example of FIGS. 2A-2C). In such examples, the slider 636 may extend parallel to a longitudinal dimension 60 of the bracket side portion 622 and includes a first latching element 640 and a second latching element 642. In certain examples, each of the first latching element 640 and the second latching element 642 is a tab. In one or more examples, the lever 634 may be actuated by an application of force (e.g., pushed or pulled) to drive the slider 636 to translate horizontally relative to the bracket side portion 622 between a first position corresponding to a fastened state of the latching assembly 616 and a second position corresponding to an unfastened state of the latching assembly 616. In some examples, in an installed state of the riser cage assembly 610 in the information processing device, the lever 634 may be pushed to drive the slider 636 along a first direction 10 to cause the first latching element 640 and the second latching element 642 of the slider 636 to engage with the first anchor 606 and the second anchor 608, respectively and thereby fasten the riser cage assembly 610 to the information processing device and translate the latching assembly 616 to the fastened state. Similarly, in the installed state of the riser cage assembly 610 in the information processing device, the lever 634 may be pulled to drive the slider 636 along a second direction 20 opposite to the first direction 10 to cause the first latching element 640 and the second latching element 642 of the slider 636 to disengage from the first anchor 606 and the second anchor 608, respectively, and thereby release the riser cage assembly 610 from the information processing device and translate the latching assembly to the unfastened state.

Figure 7:
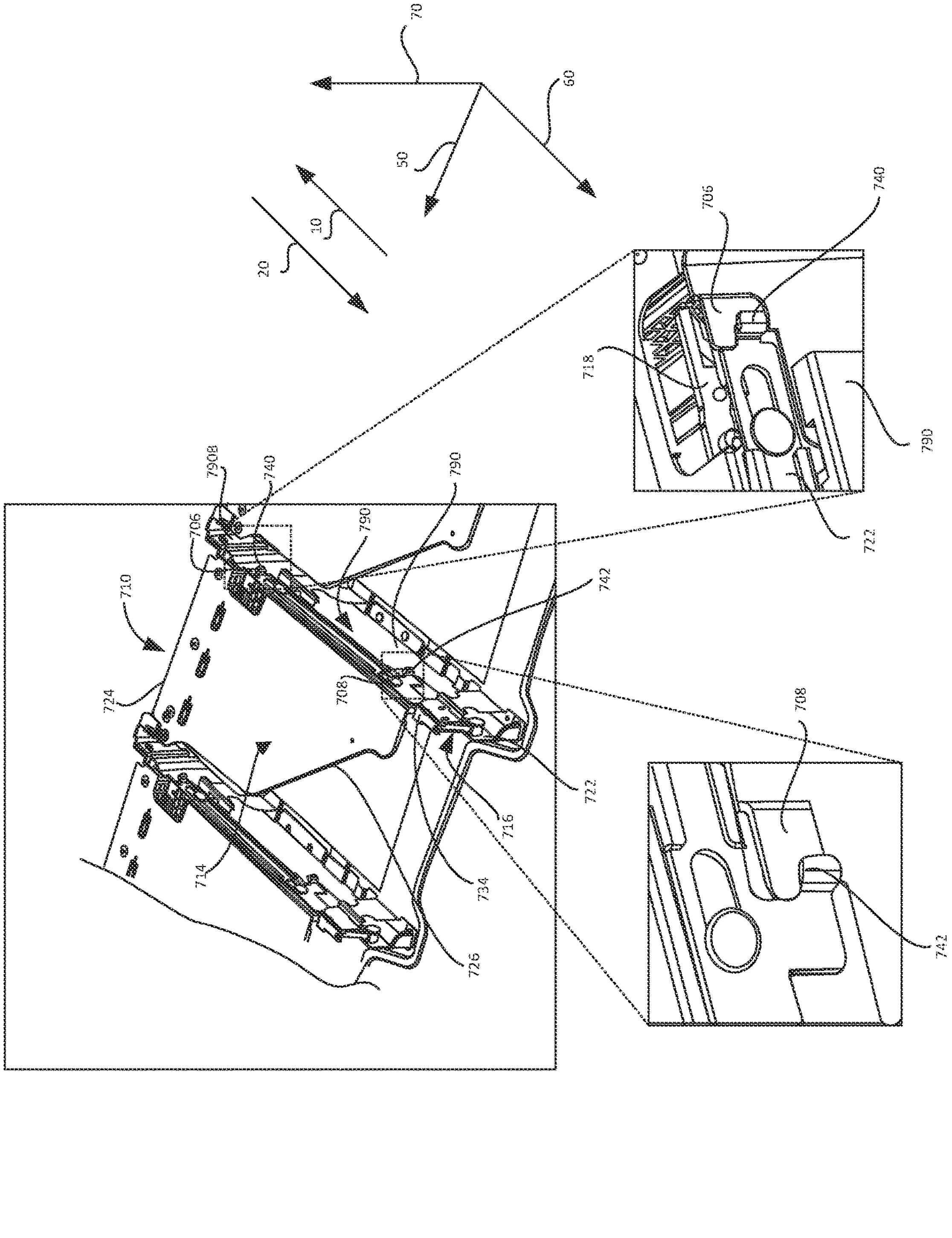
FIG. 7 illustrates a perspective view of a latching assembly having first and second latching elements coupled to first and second anchors of an information processing device according to yet another example of the present disclosure.

FIG. 7 depicts a perspective side view of a support element 790 having a first anchor 706 and a second anchor 708, and a riser cage assembly 710. In one or more examples, the support element 790 is disposed on and coupled to a chassis 704 of an information processing device. The support element 790 includes the first anchor 706 disposed at a distal end 790A and the second anchor 708 disposed at a proximal end 790B. Each of the first anchor 706 and the second anchor 708 is a retention component. In the example of FIG. 7, each of the first anchor 706 and the second anchor 708 is a hook. The riser cage assembly 710 includes a riser cage bracket 714, a latching assembly 716, a riser card 718, and an expansion card (not shown). The riser cage assembly 710 is configured to provide support to the riser card 718 and the expansion card and secure such cards to an information processing device. In some examples, the riser cage bracket 714 includes a bracket side portion 722 and a bracket window portion 724 which are coupled to each other at a right angle to define a space 726 is defined between the bracket side portion 722 and the bracket window portion 724. In such examples, the riser card 718 may be coupled to the bracket side portion 722 and the expansion card may be disposed in the space 726 and coupled to the bracket window portion 724. In some examples, the riser cage bracket 714 having the riser card 718 mounted therein, may be disposed on a primary system board (not shown) of the information processing system and positioned adjacent to the support element 790 to install the riser cage assembly 710 to the information processing device. The latching assembly 716 is a locking assembly of the riser cage assembly 710, which when actuated (e.g., pushed) may fasten the riser cage bracket 714 to the information processing device or (e.g., pulled) may release the riser cage bracket 714 from the information processing device. In certain examples, the latching assembly 716 includes a lever 734 and a slider 736 which are attached to the riser cage bracket 714. In particular, the lever 734 is rotatably coupled to the bracket side portion 722 and the slider 736 is movably coupled to the lever 734 and the bracket side portion 722 (as discussed in the example of FIGS. 2A-2C). In such examples, the slider 736 may extend parallel to a longitudinal dimension 60 of the bracket side portion 722 and includes a first latching element 740 and a second latching element 742. In certain examples, each of the first latching element 740 and the second latching element 742 is a tab. In one or more examples, the lever 734 may be actuated by an application of force (e.g., pushed or pulled) to drive the slider 736 to translate horizontally relative to the bracket side portion 722 between a first position corresponding to a fastened state of the latching assembly 716 and a second position corresponding to an unfastened state of the latching assembly 716. In some examples, in an installed state of the riser cage assembly 710 in the information processing device, the lever 734 may be pushed to drive the slider 736 along a first direction 10 to cause the first latching element 740 and the second latching element 742 of the slider 736 to engage with the first anchor 706 and the second anchor 708, respectively and thereby fasten the riser cage assembly 710 to the information processing device and translate the latching assembly 716 to the fastened state. Similarly, in the installed state of the riser cage assembly 710 in the information processing device, the lever 734 may be pulled to drive the slider 736 along a second direction 20 opposite to the first direction 10 to cause the first latching element 740 and the second latching element 742 of the slider 736 to disengage from the first anchor 706 and the second anchor 708, respectively, and thereby release the riser cage assembly 710 from the information processing device and translate the latching assembly to the unfastened state.

Figure 8:
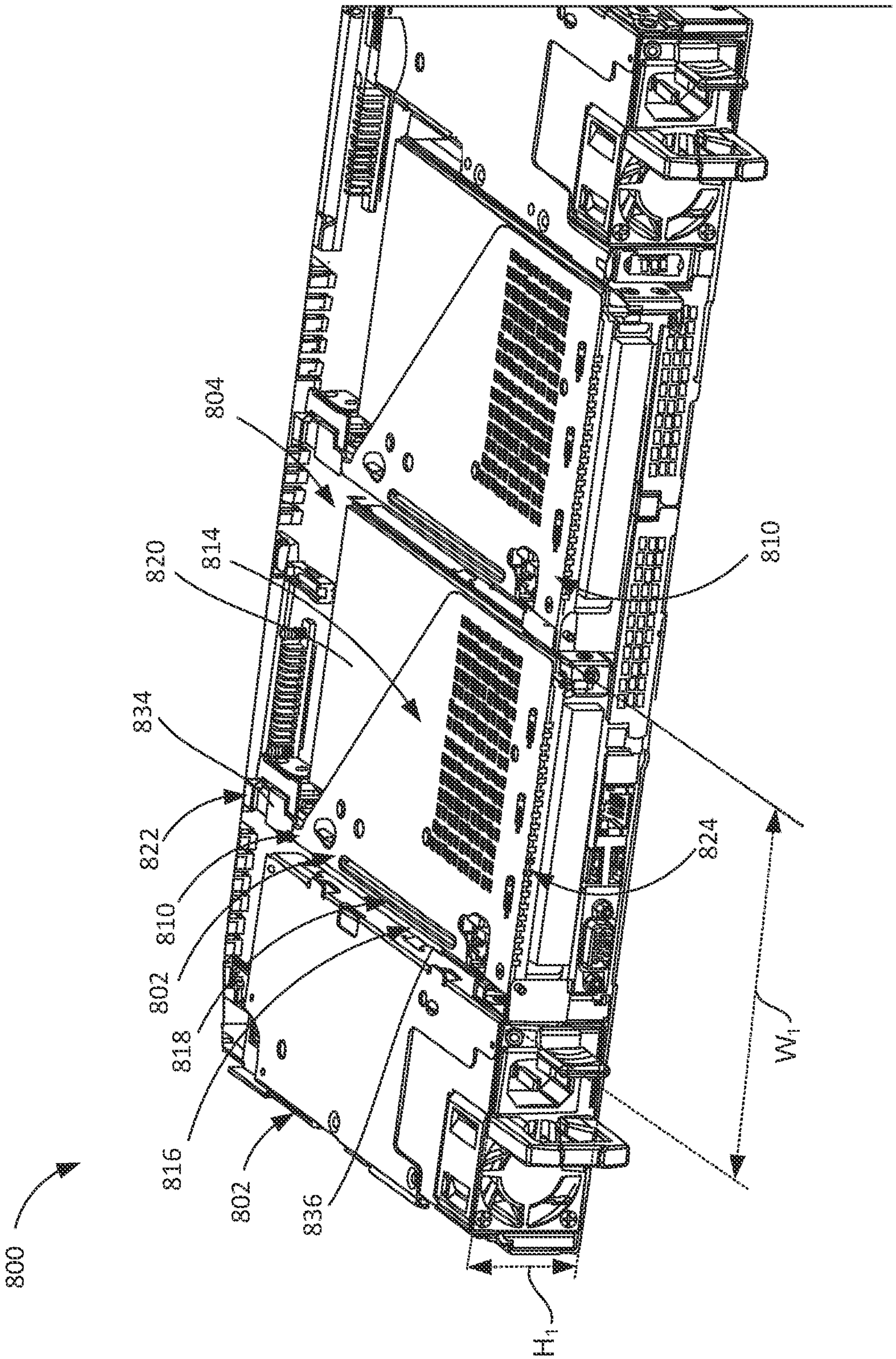
FIG. 8 illustrates a perspective view of a portion of an information processing device having a chassis, a plurality of riser cage brackets of a 1 U height, each riser cage bracket supporting an expansion card of a full-height configuration, and a latching assembly to secure each riser cage bracket to the chassis according to another example of the present disclosure.

FIG. 8 depicts a perspective view of a portion of an information processing device 800. In some examples, the information processing device 800 is a computer. The information processing device 800 includes a chassis 802, a primary system board 804, first anchors (not shown), second anchors (not shown), and a plurality of riser cage assemblies 810.

The chassis 802, the primary system board 804, first anchors, and the second anchors may be substantially similar to a chassis 502, a primary system board 504, a first anchor 506, and a second anchor 508 of an information processing device 500 discussed in the example of FIG. 5. The first anchors and second anchors are disposed spaced apart from each other and mounted on the primary system board 804. Each of the plurality of riser cage assemblies 810 includes a riser cage bracket 814, a latching assembly 816, a riser card 818, and an expansion card 820. In the example of FIG. 8, the riser cage bracket 814 has a height "$H_1$" and a width "$W_1$". The height "$H_1$" is a 1 U height, and the width "$W_1$", is equal to a full-height of the expansion card 820. Thus, each of the plurality of riser cage assemblies 810 may support the expansion card 820 having the full-height configuration. In such examples, the latching assembly 816 may also have a height, which is substantially equal to the height "$H_1$" of the riser cage bracket 814. Further, the design and configuration of the latching assembly 816 may be substantially similar to at least one of the latching assemblies 216, 616, 716 of the riser cage assemblies 210, 610, 710, respectively, as discussed in the examples of FIGS. 2A-2C, 6A-6B, and 7. For example, the latching assembly 816 includes a lever 834 and a slider 836 and is attached to the riser cage bracket 814. For example, the lever 834 is rotatably coupled to the bracket side portion 822. The slider 836 is movably coupled to the lever 834 and to the bracket side portion 822. Similarly, the riser card 818 may be substantially similar to the riser card 218, 618, 718 of the riser cage assemblies 210, 610, 710, respectively, as discussed in the example of FIGS. 2A-2C, 6A-6B, and 7. Accordingly, in one or more examples, the lever 834 may be configured to drive the slider 836 between a first position corresponding to a fastened state of the latching assembly 816 and a second position corresponding to an unfastened state of the latching assembly 816 to secure and release the riser cage assembly 810, respectively from the information processing device 800, as discussed in the example of FIGS. 2A-2C, 6A-6B, and 7.

Figure 9:
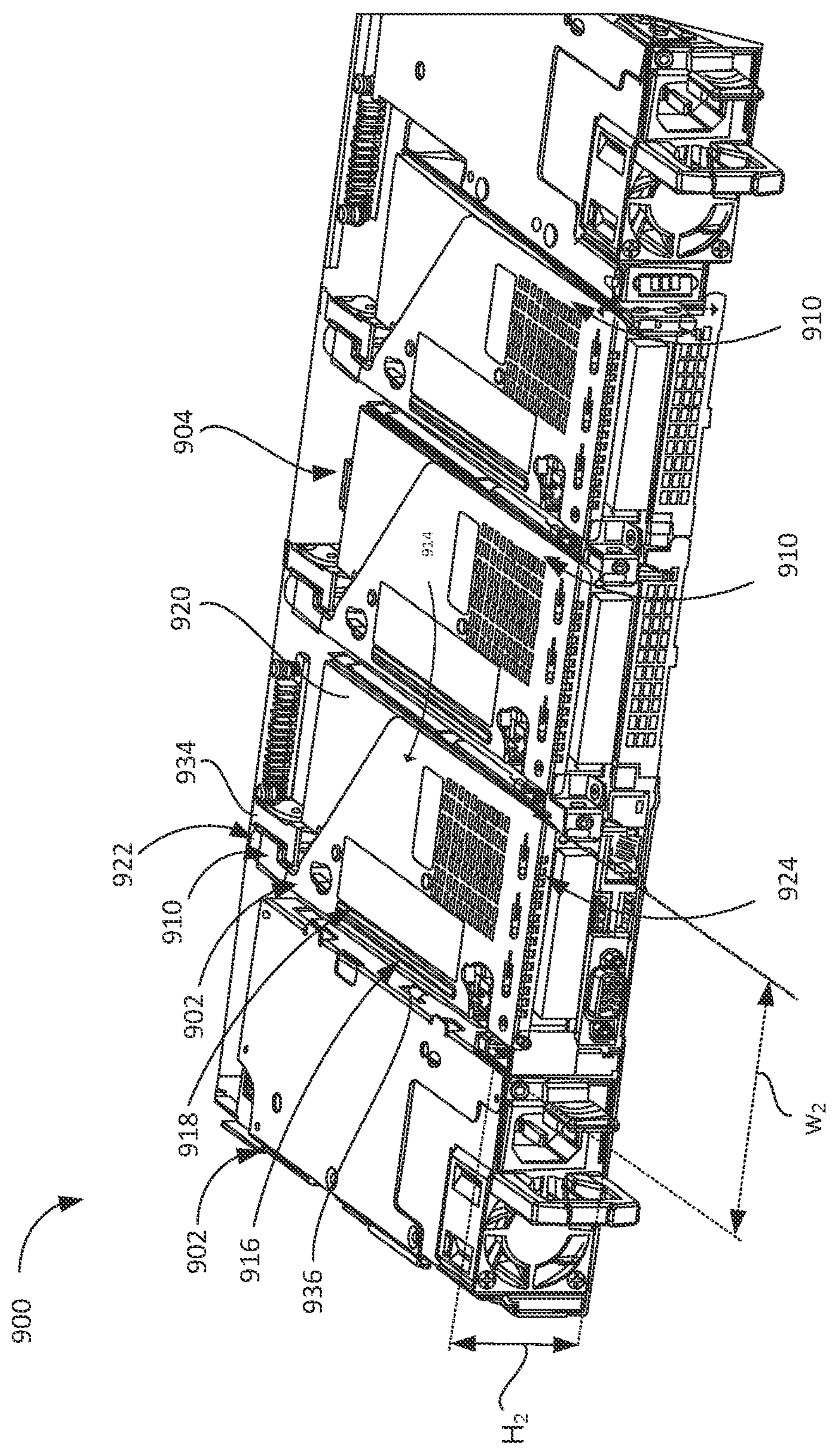
FIG. 9 illustrates a perspective view of a portion of another information processing device having a chassis, a plurality of riser cage brackets of a 1 U height, each riser cage bracket supporting an expansion card having a low-profile configuration, and a latching assembly to secure each riser cage bracket to the chassis according to an example of the present disclosure.

FIG. 9 depicts a perspective view of a portion of an information processing device 900. In some examples, the information processing device 900 is a computer. The information processing device 900 includes a chassis 902, a primary system board 904, first anchors (not shown), second anchors (not shown), and a plurality of riser cage assemblies 910.

The chassis 902, the primary system board 904, first anchors, and the second anchors may be substantially similar to a chassis 502, a primary system board 504, a first anchor 506, and a second anchor 508 of an information processing device 500 discussed in the example of FIG. 5. The first anchors and second anchors are disposed spaced apart from each other and mounted on the primary system board 904. Each of the plurality of riser cage assemblies 910 includes a riser cage bracket 914, a latching assembly 916, a riser card 918, and an expansion card 920. In the example of FIG. 9, the riser cage bracket 914 has a height "$H_2$" and a width "$W_2$". The height "$H_2$" is a 1 U height, and the width "$W_1$", is equal to a low-profile of the expansion card 920. Thus, each of the plurality of riser cage assemblies 910 may support the expansion card 920 having the low-profile configuration. In such examples, the latching assembly 916 may also have a height, which is substantially equal to the height "$H_2$" of the riser cage bracket 914. Further, the design and configuration of the latching assembly 916 may be substantially similar to at least one of the latching assemblies 216, 616, 716 of the riser cage assemblies 210, 610, 710, respectively, as discussed in the examples of FIGS. 2A-2C, 6A-6B, and 7. For example, the latching assembly 916 includes a lever 934 and a slider 936 and is attached to the riser cage bracket 914. For example, the lever 934 is rotatably coupled to the bracket side portion 922. The slider 936 is movably coupled to the lever 934 and to the bracket side portion 922. Similarly, the riser card 918 may be substantially similar to the riser card 218, 618, 718 of the riser cage assemblies 210, 610, 710, respectively, as discussed in the examples of FIGS. 2A-2C, 6A-6B, and 7. Accordingly, in one or more examples, the lever 934 may be configured to drive the slider 936 between a first position corresponding to a fastened state of the latching assembly 916 and a second position corresponding to an unfastened state of the latching assembly 916 to secure and release the riser cage assembly 910, respectively from the information processing device 900, as discussed in the example of FIGS. 2A-2C, 6A-6B, and 7.

Even though not illustrated, a riser cage bracket having a 2 U height or a 3 U height may be secured to an information processing device, using a latching assembly having a height that corresponds to the 2 U height or the 3 U height, respectively, of the riser cage bracket. In such examples, the latching assembly may additionally have a similar design and configuration to that of a latching assembly 216, 616, 716 as discussed hereinabove in the examples of FIGS. 2A-2C, 6A-6B, and 7.

Figure 10:
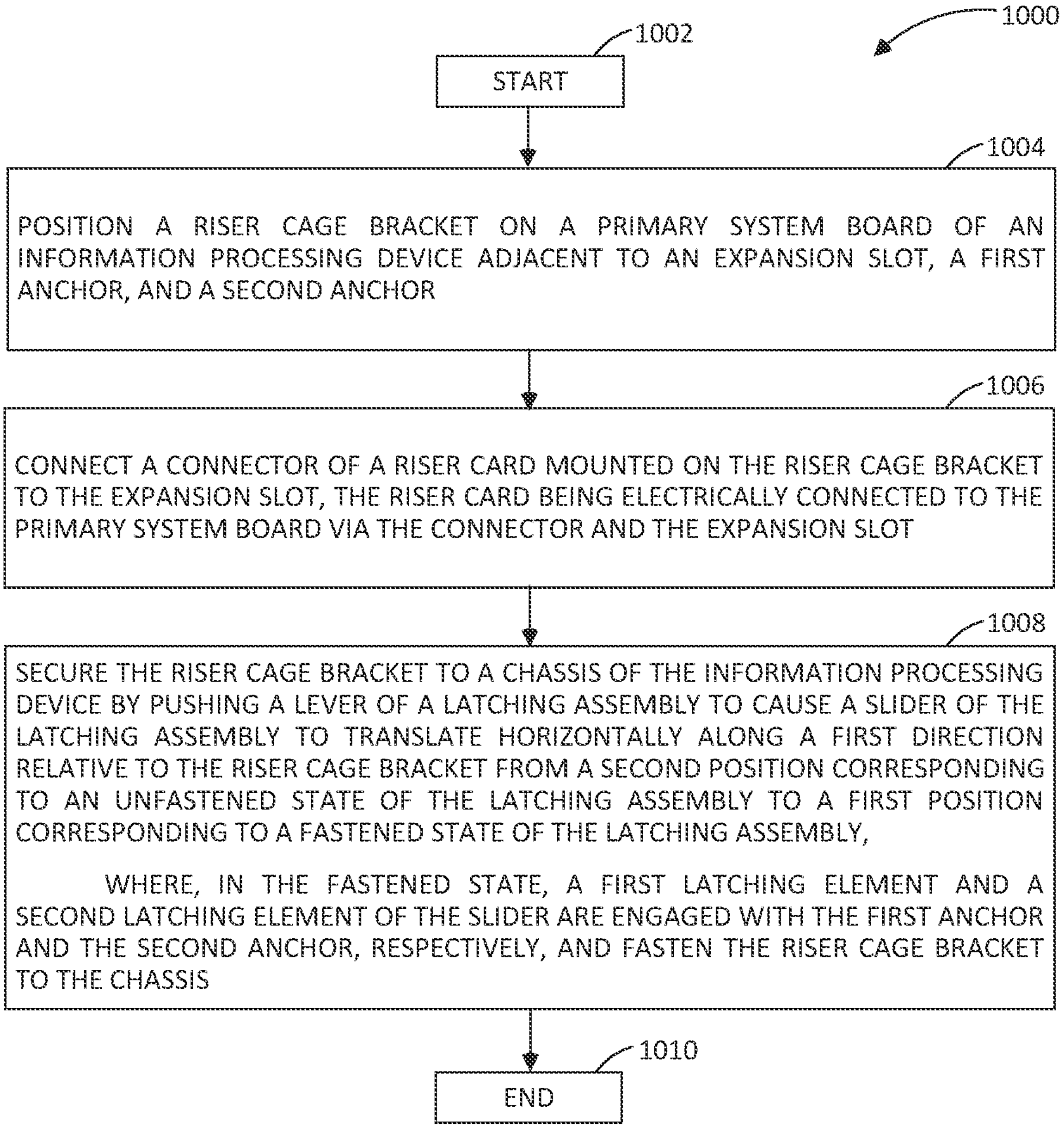
FIG. 10 is a flowchart depicting a method of securing a riser cage bracket to an information processing device using a latching assembly according to one example of the present disclosure.

FIG. 10 depicts a flow depicting a method 1000 of securing a riser cage bracket to an information processing device using a latching assembly. It may be noted herein that the method 1000 is described in conjunction with FIGS. 2A-2C, 3A-3B, and 4A-4B for example. The method 1000 starts at block 1002 and continues to block 1004.

At block 1004, the method 1000 includes positioning a riser cage bracket of the riser cage assembly on a primary system board of an information processing device adjacent to an expansion slot, a first anchor, and a second anchor. The method 1000 continues to block 1006.

At block 1006, the method 1000 includes detachably connecting a connector of a riser card mounted on the riser cage bracket to the expansion slot, the riser card being electrically connected to the primary system board via the connector and the expansion slot. The method 1000 continues to block 1008.

At block 1008, the method 1000 includes securing the riser cage bracket to a chassis of the information processing device by pushing a lever of a latching assembly to cause a slider of the latching assembly to translate horizontally along a first direction relative to the riser cage bracket from a second position corresponding to an unfastened state of the latching assembly to a first position corresponding to a fastened state of the latching assembly. In some examples, in the fastened state, a first latching element and a second latching element of the slider are engaged with the first anchor and the second anchor, respectively, and fasten the riser cage bracket to the chassis.

The method 1000 additionally includes releasing the riser cage bracket from the chassis by pulling the lever to cause the slider to translate horizontally along a second direction opposite to the first direction relative to the riser cage bracket from the first position corresponding to the fastened state of the latching assembly to the second position corresponding to the unfastened state of the latching assembly. In some examples, in the unfastened state, the first and second latching elements are disengaged from the first and second anchors, respectively, and the riser cage bracket is released from the chassis. In some examples, the first latching element is one of a hook or a tab. Similarly, the second latching element is the tab. Further, the first anchor is one of a locking spool coupled to the chassis or a first bracket coupled to the chassis, and the second anchor is a second bracket coupled to the chassis. The method ends at block 1010.

In the foregoing description, numerous details are set forth to provide an understanding of the subject matter disclosed herein. However, implementation may be practiced without some or all of these details. Other implementations may include modifications, combinations, and variations from the details discussed above. It is intended that the following claims cover such modifications and variations.

What is claimed is:

1. A riser cage assembly comprising:

a riser cage bracket comprising:

a bracket side portion; and a bracket window portion coupled perpendicularly to the bracket side portion such that a space is defined between the bracket side portion and the bracket window portion to receive an expansion card and detachably connect the expansion card to a riser card mounted on the bracket side portion; and a latching assembly comprising:

a lever rotatably coupled to the bracket side portion; and a slider movably coupled to the lever and the bracket side portion, the slider extending parallel to a longitudinal dimension of the bracket side portion and comprising a first latching element adjacent to a distal end of the slider and a second latching element adjacent to a proximal end of the slider, wherein the lever is actuatable to drive the slider to translate horizontally relative to the bracket side portion between a first position corresponding to a fastened state of the latching assembly and a second position corresponding to an unfastened state of the latching assembly, wherein, in an installed state of the riser cage assembly in an information processing device and in the fastened state, the slider is in the first position such that the first and second latching elements are engaged with a first anchor and a second anchor, respectively, of the information processing device and fasten the riser cage assembly to the information processing device;

wherein, in the installed state of the riser cage assembly in the information processing device and in the unfastened state, the slider is in the second position such that the first and second latching elements are disengaged from the first and second anchors, respectively, and the riser cage bracket is released from the information processing device.

2. The riser cage assembly of claim 1, wherein the bracket side portion comprises a first spool, a second spool, and a set of third spools, each extending perpendicularly to the longitudinal dimension of the bracket side portion.

3. The riser cage assembly of claim 2, wherein the lever comprises a handle and a set of arms connected to the handle, and wherein each arm of the set of arms comprises a first opening and a guided slot.

4. The riser cage assembly of claim 3, wherein the slider comprises a first support wall, a second support wall, and an intermediate wall connected to the first and second support walls, wherein at least one of the first and second support walls comprises the first latching element and the second latching element, wherein each of the first and second support walls comprises a second opening, and wherein the second support wall further comprises a set of slots.

5. The riser cage assembly of claim 4, wherein the lever is disposed between the first and second support walls such that the first spool is engaged to the first opening in each arm of the set of arms to rotatably couple the lever to the bracket side portion.

6. The riser cage assembly of claim 4, wherein the second spool extends between the second opening in each wall of the first and second support walls and the guided slot in each arm of the set of arms to movably couple the slider to the lever; and wherein the set of third spools is engaged to the set of slots to movably couple the slider to the bracket side portion.

7. The riser cage assembly of claim 4, wherein one arm of the set of arms further comprises a protrusion, wherein one of the first support wall or the second support wall comprises an aperture, and wherein the protrusion is configured to engage with the aperture to lock the lever in the fastened state of the latching assembly.

8. The riser cage assembly of claim 1, wherein the first latching element is one of a hook or a tab, wherein the second latching element is the tab, wherein the first anchor is one of a locking spool coupled to a chassis of the information processing device or a first bracket coupled to the chassis, and wherein the second anchor is a second bracket coupled to the chassis.

9. The riser cage assembly of claim 1, wherein the riser cage bracket has one of a 1U height, a 2U height, or a 3U height, each configured to receive at least one expansion card having a full-height configuration or a low-profile configuration.

10. The riser cage assembly of claim 1, wherein, in both the first position and the second position, the slider is mounted to the bracket side portion.

11. An information processing device comprising:

a chassis;

a primary system board having a connector;

a first anchor and a second anchor, each coupled to the chassis; and a riser cage assembly comprising:

a riser cage bracket comprising:

a bracket side portion; and a bracket window portion coupled perpendicularly to the bracket side portion; and a latching assembly comprising:

a lever rotatably coupled to the bracket side portion; and a slider movably coupled to the lever and the bracket side portion, the slider extending parallel to a longitudinal dimension of the bracket side portion and comprising a first latching element adjacent to a distal end of the slider and a second latching element adjacent to a proximal end of the slider;

an expansion card attached to the riser cage bracket and located in a space defined between the bracket side portion and the bracket window portion; and a riser card mounted to the bracket side portion and electrically connected to the connector and to the expansion card, wherein the lever is actuatable to drive the slider to translate horizontally relative to the bracket side portion between a first position corresponding to a fastened state of the latching assembly and a second position corresponding to an unfastened state of the latching assembly, wherein, in the fastened state, the slider is in the first position such that the first and second latching elements are engaged with the first and second anchors, respectively, and fasten the riser cage assembly to the chassis, wherein, in the unfastened state, the slider is in the second position such that the first and second latching elements are disengaged from the first and second anchors, respectively, and the riser cage bracket is released from the chassis.

12. The information processing device of claim 11, wherein the bracket side portion comprises a first spool, a second spool, and a set of third spools, each extending perpendicularly to the longitudinal dimension of the bracket side portion.

13. The information processing device of claim 12, wherein the lever comprises a handle and a set of arms connected to the handle, and wherein each arm of the set of arms comprises a first opening and a guided slot.

14. The information processing device of claim 13, wherein the slider comprises a first support wall, a second support wall, and an intermediate wall connected to the first and second support walls, wherein at least one of the first and second support walls comprises the first latching element and the second latching element, wherein each of the first and second support walls comprises a second opening, and wherein the second support wall further comprises a set of slots.

15. The information processing device of claim 14, wherein the lever is disposed between the first and second support walls such that the first spool is engaged to the first opening in each arm of the set of arms to rotatably couple the lever to the bracket side portion.

16. The information processing device of claim 14, wherein the second spool extends between the second opening in each wall of the first and second support walls and the guided slot in each arm of the set of arms to movably couple the slider to the lever; and wherein the set of third spools is engaged to the set of slots to movably couple the slider to the bracket side portion.

17. The information processing device of claim 11, wherein the first latching element is one of a hook or a tab, wherein the second latching element is the tab, wherein the first anchor is one of a locking spool coupled to a chassis of the information processing device or a first bracket coupled to the chassis, and wherein the second anchor is a second bracket coupled to the chassis.

18. The information processing device of claim 11, wherein the riser cage bracket has one of a 1U height, a 2U height, or a 3U height, each configured to receive at least one expansion card having a full-height configuration or a low-profile configuration.

* * * * *